United States Patent [19]

Ogawa et al.

[11] Patent Number: 4,957,337
[45] Date of Patent: Sep. 18, 1990

[54] OPTICAL QUANTUM INTERFERENCE DEVICE AND METHOD OF MODULATING LIGHT USING SAME

[75] Inventors: Kensuke Ogawa, Hachioji; Toshio Katsuyama, Ome; Tadashi Fukuzawa, Tokyo, all of Japan

[73] Assignee: Hitachi, Ltd., Tokyo, Japan

[21] Appl. No.: 348,216

[22] Filed: May 5, 1989

[30] Foreign Application Priority Data

| May 6, 1988 | [JP] | Japan | 63-108993 |
| May 25, 1988 | [JP] | Japan | 63-125711 |
| Jul. 13, 1988 | [JP] | Japan | 63-172706 |

[51] Int. Cl.$^5$ ............ G02B 6/10; G02B 5/30; G01B 9/02; H01J 5/16
[52] U.S. Cl. ............ 350/96.13; 350/96.11; 350/96.14; 350/320; 350/354; 350/355; 350/374; 356/345; 356/351; 250/211 J; 250/227.14; 357/4; 357/27; 357/30
[58] Field of Search ........... 350/96.11, 96.12, 96.13, 350/96.14, 96.29, 354, 355, 320, 370, 374, 376, 377; 357/4 SL, 17, 19, 26, 27, 30; 356/345, 351; 250/211 J, 227.11, 227.14, 231.10, 231.16, 231.19

[56] References Cited

U.S. PATENT DOCUMENTS

| 4,111,521 | 9/1978 | Streifer et al. | 350/96.13 |
| 4,525,687 | 6/1985 | Chemla et al. | 350/355 X |
| 4,546,244 | 10/1985 | Miller | 250/211 J |
| 4,693,547 | 9/1987 | Soref et al. | 350/96.13 |
| 4,716,449 | 12/1987 | Miller | 350/356 |
| 4,737,003 | 4/1988 | Matsumura et al. | 350/96.14 |
| 4,840,446 | 6/1989 | Nakamura et al. | 350/96.13 |
| 4,861,130 | 8/1989 | Katsuyama et al. | 350/96.14 |
| 4,878,723 | 11/1989 | Chen et al. | 350/96.14 |

FOREIGN PATENT DOCUMENTS 0154504  9/1985  European Pat. Off. ..... 357/4 SL X

OTHER PUBLICATIONS

"Fabry-Perot Multiple-Quantum Well Index Modulator", Applied Optics, vol. 27, No. 11, 1 Jun. 1988, pp. 2103-2104, Simes et al.
Phys. Rev. Lett. vol. 55, pp. 2344-2347, Nov. (1985).
Phys. Rev. Lett. vol. 56, pp. 2748-2751, Jun. (1986).

*Primary Examiner*—Brian Healy
*Attorney, Agent, or Firm*—Kenyon & Kenyon

[57] ABSTRACT

A device structure is provided for optical modulation using a quantum interference effect in an excited state of electron-systems. The optical modulation is performed by causing the effect of modulation on the excited state of electron-systems represented by excitons to be executed on light via the state in which the light and the excited state of electron-systems represented by the excitonic polaritons are coupled.

31 Claims, 16 Drawing Sheets

FIG. 3A
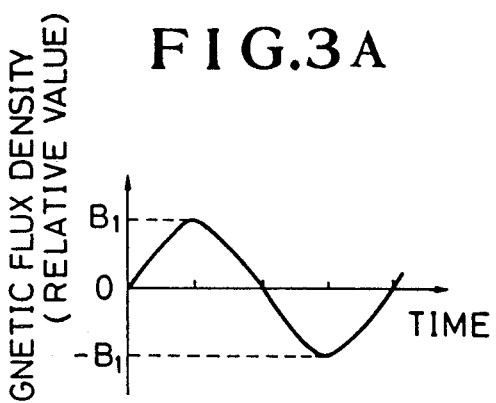
FIG. 3C
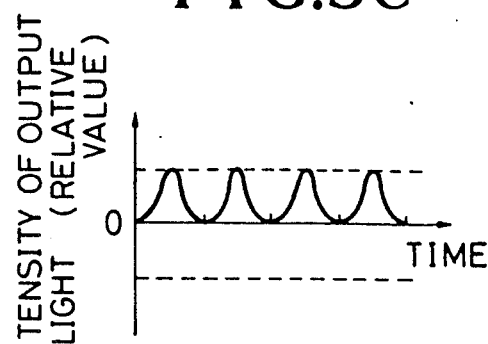
FIG. 3B
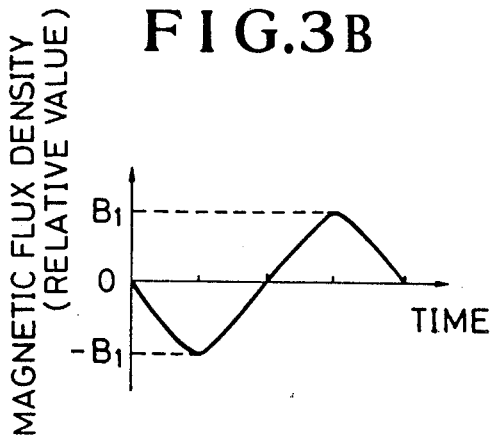
FIG. 3D

OPTICAL QUANTUM INTERFERENCE DEVICE AND METHOD OF MODULATING LIGHT USING SAME

BACKGROUND OF THE INVENTION

1. Field of the Invention

The present invention relates to optical devices which perform optical modulation, optical detection or optical logic operation, and more particularly to optical quantum interference devices which are suitable for use in optical integrated circuits such as optical computers or OEICs and have high response speed, and methods of manufacturing these devices.

In the present specification, the term "light" is used to denote electromagnetic waves generally.

2. Description of the Related Art

Using computers which perform logic operations by turning on and off a small current and by storing and emitting small charges, together with software has, greatly advanced the quest for an increase in the operation speed and miniaturization thereof. Recent interesting researches are to handle currents and fields by quantum-mechanical descriptions from the standpoint of interaction of electrons and a microfield such as that represented by a quantum well. For example, a phenomenon in which the electric conductivity of a semiconductor fine loop exhibits a magnetic vibration due to Aharanov-Bohm effect known as one of quantum interference effects, is described in *PHYSICAL REVIEW LETTERS*, Vol. 55, (1985), pp. 2344–2347. The Aharanov-Bohm effect is explained by a pure quantum-mechanical description that the wavefunction of electrons is affected by the vector potential of a magnetic field even if the electrons do not directly pass through a localized magnetic field to thereby change the phase of the wavefunction. This effect can be observed in the form of interference of electrons affected by the vector potential.

A light absorption modulation of excitons in a quantum well due to optical Stark effect is described in *PHYSICAL REVIEW LETTERS*, Vol. 56, (1986), pp. 2748–2751. The optical Stark effect is a non-linear optical effect and a phenomenon in which the energy level of excitons is shifted by interaction with an optical field.

A two-photon optical process due to the interaction of excitonic polaritons is described in *SOLID STATE COMMUNICATIONS*, Vol. 33, (1980), pp. 1135–1138.

The above conventional techniques use an electron quantum interference phenomenon due to the Aharanov-Bohm effect to modulate the conductivity of a semiconductor by sweeping the intensity of a magnetic field applied externally.

The absorption intensity modulation using the optical Stark effect of quantum well excitons and the interaction between the excitonic polaritons is difficult to realize intensity modulation at a practical efficiency.

SUMMARY OF THE INVENTION

It is an object of the present invention to provide an optical quantum interference device which solves the above problems of the conventional techniques and realizes an optical modulation based on completely novel principles of operation.

It is another object of the present invention to provide an optical quantum interference device which applies to optical devices a quantum interference effect such as Aharanov-Bohm effect caused by electron or the excited state of electron-systems to perform optical modulation, optical detection, optical logic operation at ultrahigh speed.

It is a further object of the present invention to provide an optical quantum interference device which applies a quantum interference effect, such as that represented by Aharanov-Bohm effect, to optical modulation through exciton state and/or excited state of electron-systems. This means that the realization of a device which is free from the influence of the relaxation time of the excited state of electron-systems, and from heating radiation due to the dissipation of energy of the incidence of light and magnetic flux which cause a change in the phase condition. Therefore, the optical quantum interference device according to the present invention is especially significant in manufacturing and operating ultrahigh-speed optical devices in a densely integrated form.

It is possible to provide an optical device of a novel simple structure which performs logic operations in conjunction with an optical quantum interference device using the optical Stark effect of excitonic polaritons and the interaction between excitonic polaritons.

In accordance with one aspect of the present invention, there is provided an optical quantum interference device comprising a light source for emitting a light to be modulated; a waveguide region, containing a first quantum state formed by electrons and a different particle state, for propagating the light to be modulated to form a second quantum state in conjunction with the first quantum state and maintaining the coherency of the second quantum state; modulation means for interacting with the second quantum state to apply a physical quantity to change the phase of the wavefunction to describe the second quantum state; and output (detection) means for outputting as a change in the intensity of the modulated light a change in the phase of the wavefunction to describe the second quantum state caused by the interaction. If it is especially preferable that the above mentioned different particle state is a hole, the first quantum state is an exciton state, and the second quantum state is an excitonic polariton state. According to a specified aspect of the present invention, there is provided an optical quantum interference device in which the waveguide region includes a closed circuit. The output (detection) means outputs a change in the intensity of the modulated light due to the interference effect of the wavefunction to describe the second quantum state due to a change in the phase.

According to a further specified aspect of the present invention, an optical quantum interference device is provided in which the closed circuit is formed in the vicinity of the waveguide region. The closed circuit and the waveguide region are coupled optically. The distance between the closed circuit and the waveguide region is preferably within five times the wavelength of the light to be modulated.

According to a still further aspect of the present invention, there is provided an optical quantum interference device which includes means for applying an electric field to the waveguide region. Thus the signal processing characteristic or processing efficiency of the device is changeable.

Preferably, a pn junction is provided in the waveguide region across which an electric field is applied so as to form a reverse-biased junction, or a Schottky junction is formed in the interface between the electrode and the waveguide region.

According to another specified aspect of the present invention, there is provided an optical quantum interference device in which the closed circuit has a circuit length substantially equal to the mean free path of the second quantum state.

According to a further specified aspect of the present invention, there is provided an optical quantum interference device in which the modulated light has a wavelength substantially equal to the absorption wavelength of the first quantum state or the reflection wavelength of the quantum state.

According to a further specified aspect of the present invention, there is provided an optical quantum interference device in which a possible loss of the light to be modulated in the waveguide is reduced by increasing the energy in the optical absorption edge in the device portion other than the waveguide region.

According to a further specified aspect of the present invention, there is provided an optical quantum interference device in which the physical quantity is a magnetic field.

According to a still further specified aspect of the present invention, there is provided an optical quantum interference optical device in which the magnetic field is the magnetic field component of the modulating light applied by the modulating means. Preferably, the operation section of the device to which the modulating light is applied has an anti-reflective structure which includes, for example, a stacked structure of an insulator film and a metal film formed in this order on the operation section. It is recommendable to enter the modulating light in the direction (or inclined) other than that normal to the operation section such that the magnetic field due to the modulating light has a component normal to the operation section.

According to a still further aspect of the present invention, there is provided an optical quantum interference device in which the waveguide region includes a core, at least part of which includes a quantum well structure composed of GaAs, InP, CuCl, ZnSe, CdS or their mixed crystals. These materials are especially suitable for the formation of excitonic polaritons.

According to a further aspect of the present invention, there is provided an optical quantum interference device which comprises a substrate; light to be modulated receiving section for inputting light to be modulated; a waveguide region, formed on the substrate and containing a first quantum state formed by an electron and a different particle state, for guiding from the light to be modulated receiving section the light to be modulated which forms a second quantum state in conjunction with the first quantum state and maintaining the coherency of the second quantum state; an operation section for receiving a physical quantity which changes the phase of the wavefunction of the second quantum state by coupling with the second quantum state; and a modulated light output section for outputting as a change in the intensity of the modulated light a change in the phase of the wavefunction of the second quantum state caused by the interaction.

According to a specified aspect of the present invention, there is provided an optical quantum interference device which comprises a multiple-quantum well structure between the substrate and the waveguide region for absorbing the modulating light and inducing a change in the magnetic flux.

According to a still further aspect of the present invention, there is provided an optical quantum interference device which receives a light to be modulated, shifts the phase of the wavefunction of the quantum state formed by the interaction of the light to be modulated and electrons to cause an interference of the quantum state, and outputs the interference as a change in the intensity of the modulated light.

According to a further aspect of the present invention, there is provided an optical quantum interference device which couples electrons and light through the quantum state formed in a material as a result of interaction of the electrons and the light to cause the modulation of the electron states to act on the light.

According to a further aspect of the present invention, there is provided an optical quantum interference device comprising a light to be modulated receiving section; a waveguide region containing a quantum state formed by the interaction of electrons with light to be modulated and the quantum state, for coupling the quantum state with the light to be modulated from the light to be modulated receiving section; an operation section for receiving a physical quantity to shift the phase of the wavefunction of the quantum state; and a modulated light output section for outputting as a change in the intensity of the modulated light the interference of the quantum state caused by the phase shift.

According to a still further aspect of the present invention, there is provided an optical quantum interference device comprising a semiconductor or insulator substrate, an optical waveguide with an interferometer or an optical waveguide adjacent to a loop-optical waveguide and formed on the substrate, wherein the intensity of a light to be modulated propagating through the waveguide is modulated by changing the phase conditions of the exciton state or the excited state of electron-systems by irradiating a region other than, or part of, the waveguide with the modulating light.

According to a specified aspect of the present invention, there is provided an optical quantum interference device which has a structure to apply a field to an optical waveguide to adjust a reverse bias voltage applied to the waveguide to thereby optimize the signal processing characteristic and processing efficiency of the device.

According to a further specified aspect of the present invention, there is provided an optical quantum interference logic device including a plurality of such optical interference devices combined in parallel or in multi-stage.

One advantage of the present invention is that a modulation to an excitated state of electron-systems is outputted as modulated optical phase conditions.

Another advantage of the present invention is that a modulation device which greatly improves the performance or efficiency of an optical modulation is realized.

Still further advantages of the present invention will become apparent to those of ordinary skill in the art upon reading and understanding the following detailed description of the preferred embodiments.

BRIEF DESCRIPTION OF THE DRAWINGS

The present invention will be described in detail below, with reference to the drawings briefly described below.

FIGS. 3A, 3B, 3C and 3D illustrate changes with time in the flux density of modulating light and in the intensity of the modulated output light.

DETAILED DESCRIPTION OF THE PRESENT INVENTION

Figure 1:
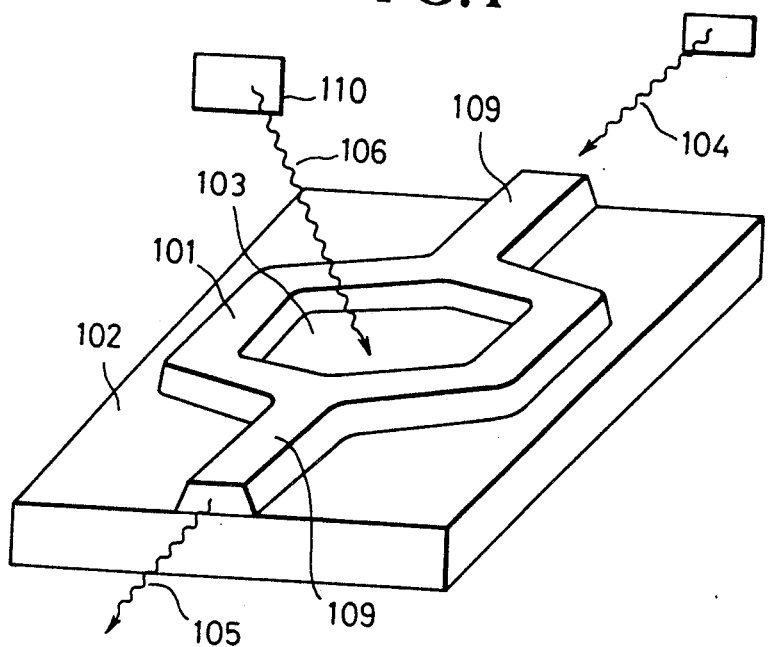
FIG. 1 shows the illustrative appearance of an embodiment of an optical quantum interference device according to the present invention.

If light is entered into an optical waveguide structure (interferometer) having a closed circuit represented by a Mach-Zehnder type optical waveguide, it is divided into two beams, which are then united, i.e., an optical interference loop is formed. If the waveguide region with such interferometer is made of a material in which a quantum state (first quantum state) such as an excited state of electron-systems represented by an exciton state exists and light (modulated light) coupling with the first quantum state is propagated through the optical waveguide, an optical interference loop is formed having a mode to maintain constant the phase condition of a second quantum state formed by the interaction of the modulated light and the first quantum state. The term "coupling" involves the state of the system obtained when the energy of the incident light is caused to substantially coincide with the energy level in the first quantum state, and that state is the condition required for the effective existence of the second quantum state. In order to realize such "coupling" of the incident light and the excited state of electron-systems, the first quantum state is required to be a system to form a polarization as in an exciton state. If a magnetic field is applied so as to pass through a window (operation section) which is the region surrounded by the interferometer, and the intensity of the magnetic field is swept, the phase conditions of the second quantum state change by the interaction of the first quantum state and an external acting factor called the Aharanov-Bohm effect, and the intensity of the emission light is modulated by the quantum interference effect.

If an optical magnetic field component is used as a source of a magnetic field, an intensity modulation by light of a frequency in the far infrared region is effective because it is desirable that the optical magnetic field component is substantially constant during the time in which the excitonic polaritons propagate through the loop-like structure. For example, if the interferometer is about 100μm long, it takes about 0.1–1 ps for the excitonic polaritons to propagate through the interferometer. Thus the modulation rate is determined and the far infrared light has a period similar to that time.

The modulation frequency is an integer times the frequency of the incident far infrared light as source of magnetic field. If the window is irradiated with light, in a circularly polarized state, having energy coincident with the absorption wavelength of the exciton state of the window region, a magnetic moment is induced to thereby cause a change in the magnetic field to satisfy a change in the phase conditions due to Aharanov-Bohm effect. This phenomenon can be expected to produce a particularly remarkable effect under the application of a steady-state magnetic field, and thus a quantum interference optical device having a superhigh speed response with a ultrashort pulse from a dye laser or the like is realized using such phenomenon.

A similar device can be fabricated using a linear optical waveguide with an adjacent loop-like optical waveguide. The light incident to the linear optical waveguide propagates also into the adjacent loop-like waveguide by the leakage of the field. Usually, with such structure in a state called an optically coupled state, it is possible to modulate the intensity of the output light by applying a magnetic field so as to extend through a window provided in the region surrounded by the loop-like waveguide. The efficient optical coupling is achieved with a distance substantially equal to the wavelength or a distance of less than five times the wavelength of the modulated light.

It is possible to add the freedom of modulation to the system. For example, it is effective to sweep an electric field over an interferometer such as that mentioned above. If an electric field is applied across the optical waveguide constituting the interferometer, the state of excitons and excited state of electron-systems is polarized, which causes a change in the charge state, which, in turn, causes a fluctuation of the period of a change in the phase due to the intensity of the magnetic field. If an electric field is applied across a part of the interferometer to control the phase conditions of the quantum interference effect and a magnetic field is irradiated, it is possible to select between a maximum and a minimum intensities of the output emission.

It is possible to realize a quantum interference device which modulates the intensity of the light by changing the phase conditions of the interferometer similarly even by using optical Stark effect or the interaction of excitonic polaritons as well as by Aharonov-Bohm effect. According to this device, the "energy wavelength dispersion characteristic" of excitonic polaritons or excited state of electron-systems is changed and applied to a change in the phase on the basis of non-linear optical process such as optical Stark effect and a two-photon process of the excitonic polaritons.

A logic operation device to which the operational principles of the present invention are applied will be described with reference to FIGS. 1, 2 and 3. The basic structure and operational principles of the device may be applicable to other applied devices such as photodetectors.

FIG. 1 shows the basic structure of an optical quantum interference device according to the present invention used to explain the operational principles of the device. The device includes a loop-like structure 01 of a semiconductor or an insulator, an optical waveguide 109 made of the same material as the structure 01 and coupled optically to at least the structure 101, and an operation section 103 constituted by the inside of the loop structure 101, these elements being formed on a substrate 102. The light to be modulated 104 is entered into the waveguide 109 and at the same time modulating light 106 is entered into the operation section 103. If the Aharonov-Bohm effect of electrons within the loop-like structure 101 is used, it is important to irradiate the modulating light 106 onto the region surrounded by the loop structure 101 through which the light to be modulated 104 propagates because the electron component of the wavefunction of excitons is required to be connected double in the loop structure 101. Of course, since the modulating light 106 has a magnetic field component, its vector potential also acts in the loop structure 101. The optical modulation is performed as a change in the intensity of the modulated light output 05 obtained by irradiation of the modulating light 106.

Figure 2:
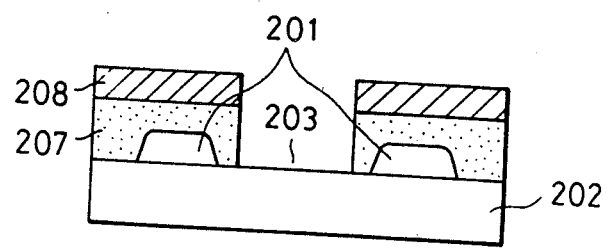
FIG. 2 is a cross section view of the device of FIG. 1.

FIG. 2 is a cross section view of the device structure shown in FIG. 1. An insulator film 207, for example, of $SiO_2$, covering the loop structure formed on the substrate 202 and a light screening metal film 208 preventing the modulation light from being irradiated onto the loop structure are formed although not shown in FIG. 1.

Considering the guide of the light to be modulated propagating in a single mode, the waveguide region including the loop-like structure 201 and waveguide 109 are preferably 0.05–10 $\mu$m broad. The portion of the waveguide region which effectively confines light therein is preferably 5–10 $\mu$m thick. As shown in FIG. 1, if a so-called Mach-Zehnder waveguide structure is used as shown in FIG. 1, the distance between the two branches of the loop-like structure is preferably 5 $\mu$m –1 mm.

FIGS. 3A and 3B, and FIGS. 3C and 3D show a change with time in the magnetic flux density of the modulating light 106 irradiated onto the operation section 103 of FIG. 1 and a change with time in the output intensity of the modulated light 105, respectively. The wave function $\psi_{ex}(r)$ of an exciton is represented as follows in accordance with a quantum mechanical description:

$$\psi_{ex}(r) = f(r)\phi_e(r)\phi_h(r)$$

where $\phi_e(r)$ and $\phi_h(r)$ are the wavefunctions of an electron and a hole, f(r) is an envelope function similar in form to that of the hydrogen atom, and r is a position vector. The Aharonov-Bohm effect of excitonic polaritons which is one of the quantum interference effects that the present invention uses (such representation may be not general, but is often used for simplifying purposes in this specification) is based on the fact that the wavefunction of the excitons as a source of polarization coupled with light in a medium is constituted by the product of the respective wavefunctions of electrons and holes and that the phase components of the respective wavefunction components of electrons and holes change depending on the action of the magnetic field. The wavefunction of the excitonic polaritons is represented by the combination of the wavefunction that describes a photon and the wavefunction that describes on the exciton. Such combined state results in the exertion of a modulation to an exciton component on light which performs this combination. Since the absolute charge values of the electron and hole are equal, the periods of their phase changes are equal. Therefore, the Aharonov-Bohm effect is not reduced even if the wavefunction of the exciton takes the form of the product of both the respective wavefunctions of the electron and holes.

Modulated light 104 of a wavelength in the vicinity of the wavelength to generate the absorption peak of an exciton (preferably within ±20 nm) is entered into the optical waveguide 109. Thus, a change in the phase of the exciton wavefunction is reflected completely on the excitonic polariton. The magnetic flux $\Phi_0$ corresponding to the period of a change in the intensity of the modulated light output 105 is determined by $$\Phi_0 = hc/e$$

where h, c and e are the plank constant, the velocity of light and the quantity of a single charge, respectively. The flux density $B_0$ necessary for providing a flux $\Phi_0$ is given by $$B_0 = \Phi_0/S = hc/eS$$

where S is the effective region of the operation section 103.

One example of logic operations will be described. Assume now that $B_1$ is the amplitude of the flux density of modulating light 106, and an example where $B_1=B_0$ will be taken. Also, the modulating light shown in FIG. 3A is caused to correspond to a +1 sign and the modulating light shown FIG. 3B is caused to correspond to a −1 sign. If the modulating light of FIG. 3A is irradiated onto the operation region, the intensity of the modulated light output exhibits a change with time, as shown in FIG. 3C, due to Aharonov-Bohm effect. If the flux density of the modulation light changes like $0 \rightarrow B_1\ 0$ with time, the detected signal has two peaks because two oscillatory periods are contained. If the modulating light of FIG. 3A and the modulating light of FIG. 3B are simultaneously irradiated, they cancel each other, so that the output intensity does not change at all. This corresponds to the operation $1+(31\ 1)=0$. If two such modulating light beams of FIG. 3A are irradiated, the resulting amplitude is doubled. In this case, a change in the intensity of the output light is as shown in FIG. 3 with the number of peaks being twice that of FIG. 3C. This state corresponds to the equation $1+1=2$. In this way, logic operations are possible.

If the present invention is used as a photodetector, it is attained more simply by observing a change in the intensity of the modulated light output when a single modulating light beam is irradiated.

In order to effectively produce the Aharonov-Bohm effect, it is necessary that the magnetic field of the light has a large component normal to the loop surface. To this end, the modulating light is required to be irradiated at an incident angle to a normal to the loop surface.

The operational principles of an optical quantum interference device using an optical Stark effect as another form of the present invention will be described by way of a specific example.

Figure 4:
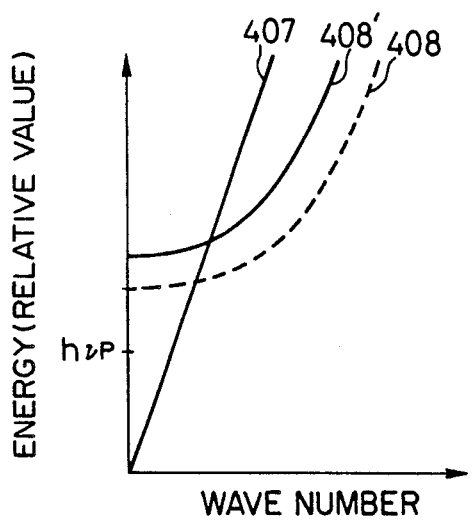
FIG. 4 illustrates the respective dispersion relation between light and excitons in a material.

FIG. 4 is a graph indicative of the respective dispersion relation between the excitons (408, 408′) and light (407). In the region in which the exciton and light resonate, the dispersion relation between the excitonic polaritons is reflected and the wavelength of the excitonic polaritons greatly is changed. Therefore, even when the power of the modulating light, sufficiently low compared to the power of the modulating light used in the conventional techniques, is irradiated onto a material present in the excited state, it is possible to greatly shift the wavelength of the excitonic polaritons. This great shift in the resonant absorption wavelength of the excitonic polaritons suggests the application of a quantum interference effect in a wide wavelength region to an optical modulating device.

Figure 5A:
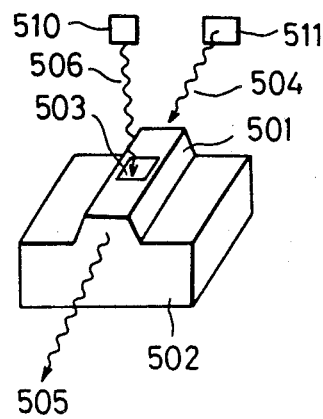
FIGS. 5A and 5B illustrate an embodiment of an optical quantum interference device according to the present invention using optical Stark effect.
Figure 5B:
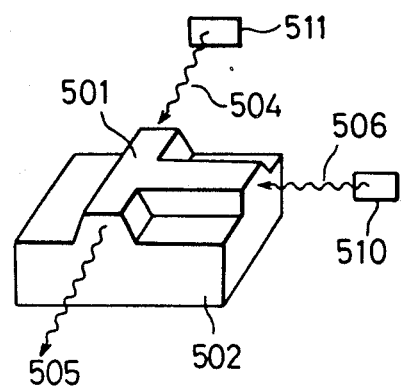

FIGS. 5A and 5B conceptually illustrate the operational principles of an optical device using a characteristic dispersion relation of the excitonic polaritons shown in FIG. 4. Light to be modulated 504 and modulating light 506 are entered into an optical waveguide 501 of a semiconductor or an insulator formed on a substrate 502 to provide a modulated output 505. FIG. 5A shows a device with a linear optical waveguide while FIG. 5B shows a device with intersecting optical waveguides. In FIG. 5A, a window 503 as the operation section through which the modulating light 506 is entered is especially provided. The window 503 is used to increase the intensity of the modulating light 506 fed into the optical waveguide 501 using the transmission, interference, etc., of light. In FIG. 4, $h\nu_p$ denotes the photon energy of the modulating light 506 and is lower than the exciton energy level. If the modulating light has energy equal to the exciton energy level or higher, it directly excites electrons and holes, so that the response time is limited by the recombination lifetime of electron-hole pairs. If the wavelength of the modulating light greatly deviates from the absorption wavelength of the excitons, a change in the phase of the excitonic polaritons due to the optical Stark effect will be reduced, so that the wavelength of the modulating light is preferably within the exciton absorption wavelength ±10 nm.

The optical Stark effect of the excitons will be described below. The dispersion relation of the excitons in an unirradiated state is given as shown by the broken line 408. By the incidence of the modulating light 506, this light and the exciton state are mixed and the resulting state shifts toward a higher-energy side, so that the dispersive curve changes from 408 to 408′. This phenomenon occurs with a short response time on the order of picoseconds or less. As the result of the interaction of light and excitons, the excitonic polaritons are formed.

Figure 6:
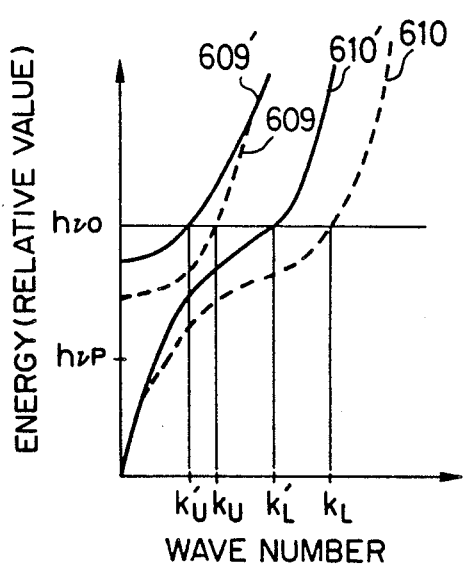
FIG. 6 illustrates the dispersion relation of excitonic polaritons.

FIG. 6 shows the dispersion relation of the excitonic polaritons. The dispersion relation is represented by the broken lines 609 and 610 corresponding to an upper and a lower branch polaritons, respectively. By the optical Stark effect due to the incidence of the modulated light 506 having energy of $h\nu_p$, the dispersion relation changes as shown by 609′ and 610′. Similarly, if the modulated light 504 of energy $h\nu_0$ is entered and the excitonic polaritons are generated thereby, the dispersion relation of the excitonic polaritons is represented by 609 and 610 if no modulating light 506 is entered, so that the wave number of the excitonic polaritons is $k_u$ for the upper branch polariton and $k_l$ for the lower branch polariton. If the modulating light 506 is entered, the dispersion relation changes to 609′ and 610′ due to optical Stark effect. Since energy is not transferred from light to the excitonic polariton by the Stark effect, the energy of the excitonic polariton maintains the value of $h\nu_0$. As a result, the wave number of the upper and lower branch polaritons are $k_u'$ and $k_l'$, respectively.

By the irradiation of the modulating light, it is possible to change the wavelength of excitonic polaritons in the region (the operation section) onto which the modulating light is irradiated. The excitonic polaritons having passed through the operation region relatively changes in phase compared to the excitonic polaritons having not passed through the operation region. Therefore, optical modulation is realized by comparison of the light to be modulated having not passed through the operation region and the light to be modulated having passed through the region. Further, by causing these two light beams to interfere with each other and then using the resulting light as an output, the modulation of the optical intensity corresponding to a quantity of change in the phase is realized. If the energy $h\nu_0$ of the light to be modulated 504 is lower than the exciton energy level (represented by the intersection with the axis of ordinates of the dispersive curves on the excitons shown by the broken lines 408 in FIG. 4), only the lower branch polariton is generated and the above effect is produced only in the lower branch polariton.

If optical Stark effect is applied to the excitonic polariton, modulation can be performed at a very low output compared to the mere use of excitons. If this modulation is performed optically by the excitons, an energy shift along the axis of ordinates of FIG. 4 is used, so that a quantity of energy shift is not large enough to perform modulation so long as a large output laser of about 1 GW cm$^{-2}$ is not irradiated.

If the excitonic polaritons are used, light in the vicinity of the region where the light and excitons resonate is used as the light to be modulated, so that a large change in the wavelength is realized by a low output laser beam or the like and can be used for optical modulation.

If a dye laser beam of a peak power density, for example, of 1 KW cm$^{-2}$, is irradiated via an objective, etc., onto an optical waveguide as a beam of an about 10-μm diameter, the exciton level energy is shifted by about 0.1 meV by the irradiation of the dye laser. However, it is predicted that the wavelength of the excitonic polaritons changes by about 10% from the dispersive curves. If modulating light is irradiated onto a portion (the operation section) 4 μm long when the wavelength of excitonic polaritons is in the vicinity of 800 nm, the phase of the modulated light having passed through the irradiated region is changed by a half wavelength, which means realizing a miniaturized optical device which has not existed in the past. Since the basic phenomenon of the operation has a high-speed response time on the order of subpicoseconds, it is possible to realize a superhigh-speed optical modulating device.

The present invention will now be described in detail with reference to examples thereof.

Example 1

Figure 7:
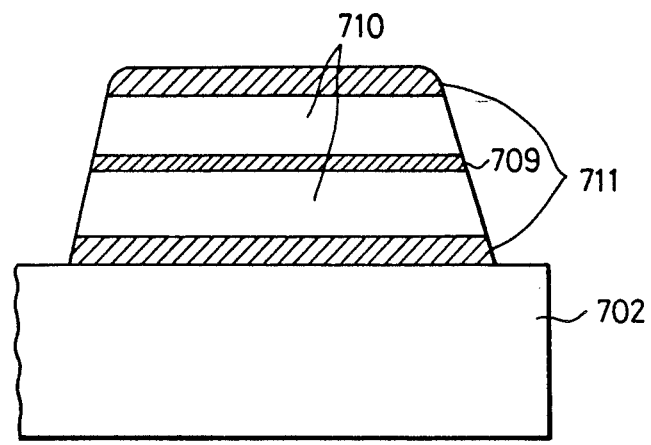
FIG. 7 illustrates one example of the cross section structure of a waveguide of the device shown in FIG. 1.

Grown by MBE on a semi-insulating GaAs substrate 702 in FIG. 7 were a GaAs quantum well layer 709 (50 Å thick) and a pair of Al$_{l-x}$Ga$_x$As (x = 0.7) (core layers) 1.5 μm thick such that the core layers 710 were provided one on each of an upper and lower surfaces of the quantum well layer 709. The core layers 701 also functioned as a barrier against the layer 709. Cladding layers 711 of GaAs (1 μm thick) were provided so as to hold the cores therebetween. A laminate of these layers 709, 710 and 711 was exposed to an electron beam and then subjected to dry etching. The resulting halffinished loop-like optical waveguide product is shown in cross section view in FIG. 7. The loop was 5 μm broad. A SiO$_2$ insulator layer (not shown) 100 nm thick was then formed by sputtering and a light screening silver film (not shown) was superposed 100 nm thick on the insulator film by sputtering. Thereafter, the operation section was formed by dry etching. The window was sized to be 100 nm × 100 nm. Thus the device shown in FIG. 1 or FIG. 2 was obtained.

This device was then cooled to 4.2° K. in liquid helium to eliminate the excitonic polariton scattering due to thermal vibrations and then measurement was done. In order to maintain the coherency of the excitonic polaritons in the optical waveguide region of the optical quantum interference device according to the present invention, cooling was not necessarily needed. The maintenance of the coherency was possible using a crystal of low impurity density and of low lattice defects. It was necessary to select light of a wavelength close to the wavelength at which the exciton absorption peak occurs to increase the coupling of the light to be modulated and the excitons in the quantum well. In this example, light of a wavelength of 750 nm from a dye laser was used as the light to be modulated and the intensity of the light output from the optical waveguide is measured. When light of a wavelength of 119 μm from a far infrared laser was irradiated as the modulating light onto the window (operation region), a change corresponding to the modulating light was generated in the optical output intensity to thereby enable photodetection. The optical response time of this device was on the order of subpicoseconds.

Example 2

A device similar to the Example 1 in FIG. 1 was prepared. The substrate 702 used was made of InP doped with Fe. The loop prepared included quantum well layer 709, core layers 710 and cladding layers 711 of In$_{1-x}$Ga$_x$As$_{1-y}$P$_y$(x=0.4, y=0.15), InP, and In$_{1-x}$Ga$_x$As$_{l-y}$P$_y$, respectively. Measurement was done at 4.2° K. using light of a wavelength 1.5 μm from an optical communication laser as the light to be modulated. As a result, a response characteristic similar to that of Example 1 was obtained.

Example 3

A CuCl optical waveguide was prepared on a CuCl substrate 702 by electron beam exposure and dry etching used in the Example 1. Measurement similar to that in the Example 1 was done at 4.2° K. and a response time on the order of subpicoseconds was obtained.

Example 4

Figure 8:
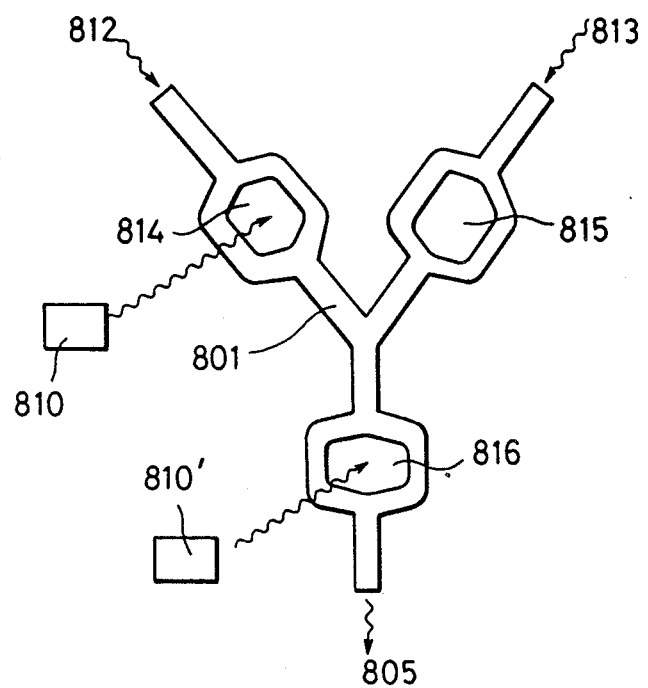
FIG. 8 illustrates an embodiment of an optical quantum interference device according to the present invention constituting an integrated optical logic device.

As shown in FIG. 8, three devices similar to that prepared in the Example 1 were integrated on a substrate (not shown). When one light to be modulated 812 alone was entered into the resulting device at 4.2° K., the output light 805 changed by irradiation of modulating light (119 μm) from two light sources 810 and 810' onto windows 814 and 816. The incident light 812 was modulated by the modulating light irradiated onto the window 814, and modulated by the modulating light irradiated onto the window 816. When these two windows are irradiated with the modulating light, the output light changed in the form of the product of the two modulating light beams. When another light to be modulated 813 was irradiated as shown, the output light 805 provided a maximum output intensity when the light beams 812 and 813 coincide in phase, and the output intensity was nullified when the light beams 812 and 813 were π out of phase. By irradiating light from another light source not shown onto the window 815, even the incident light 813 was also modulated to thereby enable complicated signal processing.

Example 5

Figure 9:
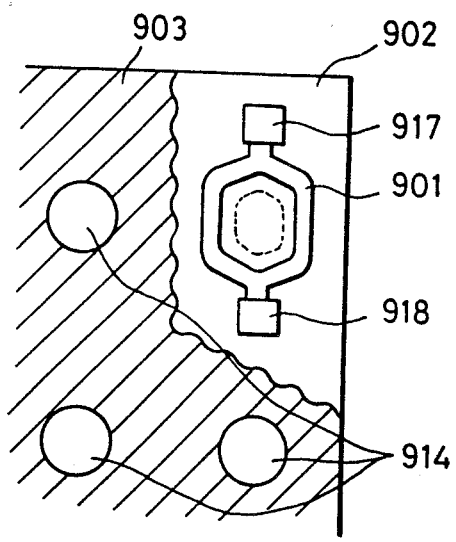
FIG. 9 illustrates a photodetector to which an optical quantum interference device according to the present invention is applied.

An AlGaAs DH laser 917 shown in FIG. 9 as the source of the light to be modulated and a photodetector 918 which used an input light laser under backward bias conditions were connected to a waveguide region 901 of a device fabricated as in Example 1 in a 2-dimensional array on a substrate 902. A cover 903 was provided with windows 914 transparent to the modulating light.

If modulating light of 119 μm was irradiated onto the windows 914 arranged in a 2-dimensional array, the device functioned as a 2-dimensional position sensor.

Example 6

A quantum well layer 709 similar to that of FIG. 7 was made of a laminate of five pairs of GaAs (50 Å thick) and Al$_{l-x}$Ga$_x$As (x = 0.7, 60 Å thick) layers. A linear waveguide portion other than the loop structure was heated to 550° C. for ten minutes to diffuse Zn therein to thereby form a mixed crystal structure. Thus a device similar to the example 1 was prepared.

The responsiveness to the modulating light was increased and the attenuation of excitonic polaritons by the waveguide portion other than the loop was reduced.

Example 7

Figure 10:
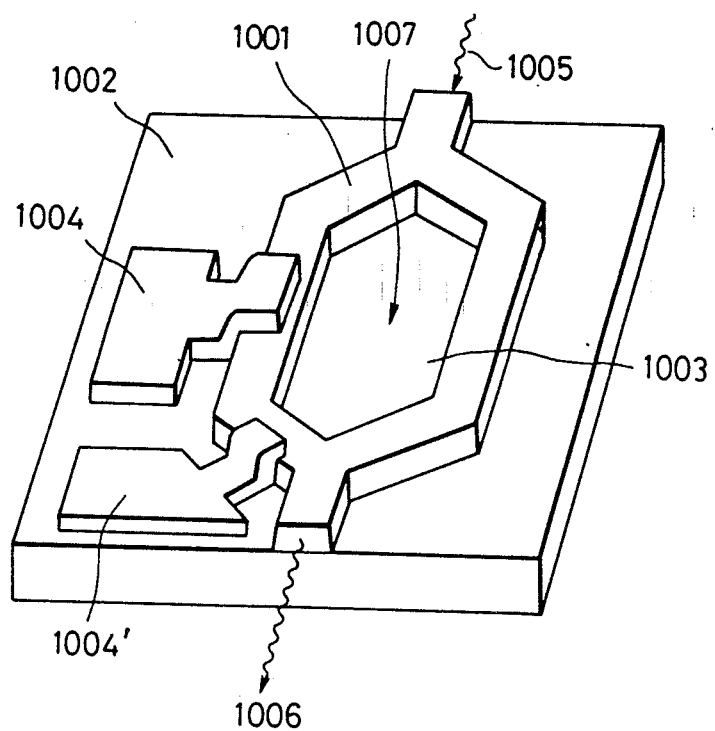
FIG. 10 illustrates the appearance of another embodiment of the optical quantum interference device according to the present invention.

This example will be described with reference to FIGS. 10–12. FIG. 10 illustrates the appearance of an optical quantum interference device to modulate the optical intensity using a steady-state magnetic field or light. The optical waveguide 1001 was formed on a substrate 1002 with a Mach-Zehnder interferometer. The light to be modulated 1005 was irradiated onto the incident end of the optical waveguide to thereby cause excitonic polaritons to propagate through the optical waveguide. At this time, magnetic flux or light 1007 was entered for modulation into a window 1003 provided in the region surrounded by the Mach-Zehnder interferometer. In accordance with the intensity of the magnetic flux or light, the phase of the excitonic polaritons changed and the intensity of the output modulated light 1006 was changed.

A pad 1004 was used to control the field strength applied across the entire optical waveguide 1001. Thus the magnitude of the exciton polarization was adjusted and the degree of the quantum interference effect was controlled externally. A pad 1004' was used to apply a field across part of the Mach-Zehnder interferometer to select between symmetrical and antisymmetrical setting of the interferometer. The symmetrical setting means that the phase of light propagating through the interferometer deviated by an integer times a half wavelength when a physical quantity (factor) 1007 to modulate magnetic flux or light was applied onto the window 1007 to thereby nullify the intensity of the output light 1006. By the anti-symmetrical setting, it was meant that the phase of light propagating through the interferometer when no physical quantity 1007 was applied deviated only by an integer times a half wave, no output light 1006 was obtained while the output light was obtained when the quantity 1007 was applied. At the same time, by finely adjusting the voltage applied across the pad 1004', the light modulation efficiency was changed (maximized).

The optical waveguide was 1.5 $\mu$m broad, and the Mach-Zehnder interferometer was 500 $\mu$m long and 50 $\mu$m broad. The linear optical waveguide connected to the interferometer was 100 $\mu$m long.

Figure 11:
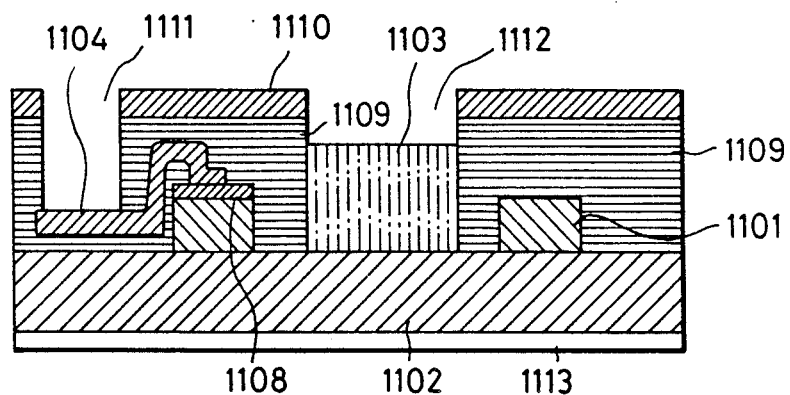
FIG. 11 is a cross section view of an optical waveguide loop of the device of FIG. 10.
Figure 12:
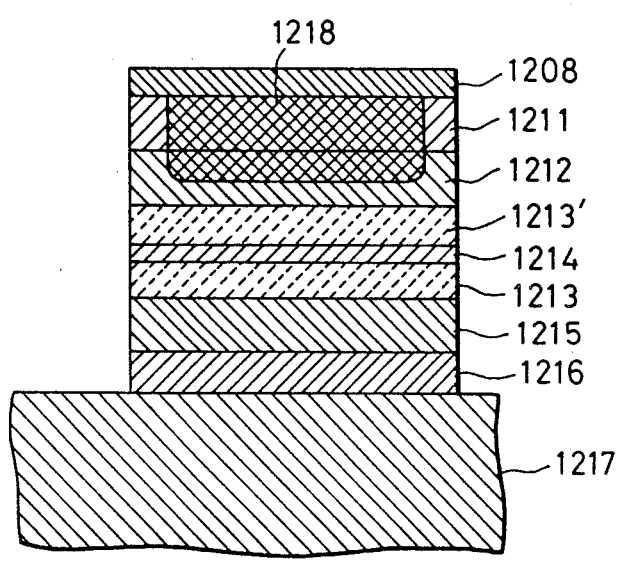
FIG. 12 is a cross section view of the optical waveguide of FIG. 10.
Figure 13:
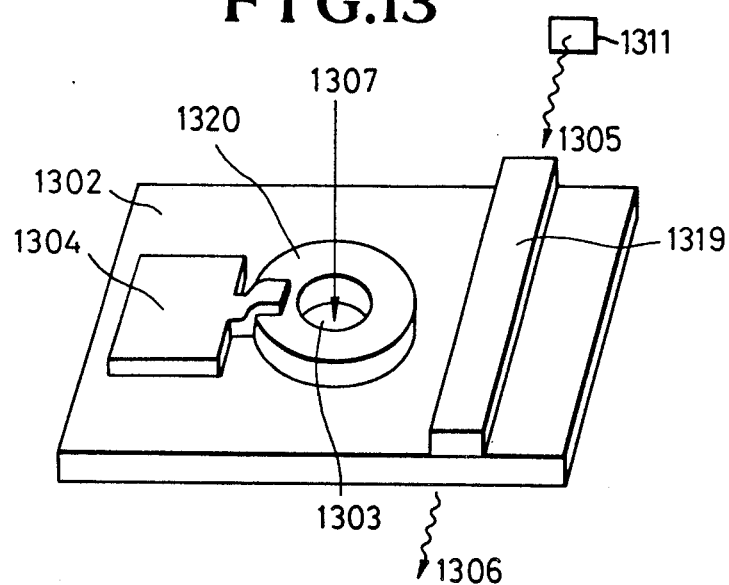
FIG. 13 illustrates the appearance of a further embodiment of the optical quantum interference device according to the present invention, including an optical waveguide with an adjacent loop-like optical waveguide.

FIG. 11 shows a cross section taken across the pad 1004 of the device of the structure shown in FIG. 10 and perpendicular to the direction of propagation of light. The optical waveguide formed on substrate 1102 was processed by dry etching into a ridge type one to obtain an optical waveguide 1101, the cross section of which is shown in FIG. 12.

In order to apply a field across the optical waveguide, a pn junction was formed in the direction perpendicular to the substrate surface. A backward bias field was applied across the pn junction. An n+ − GaAs wafer substrate 1217 of a carrier density of $10^{18}$ cm$^{-3}$ and containing Si was used as the substrate 1102 of FIG. 11. The waveguide layer was prepared by MBE. Si and Zn were added at a carrier density of $10^{17}$ cm$^{-3}$ in the n- and p-layers, respectively. A 0.3−$\mu$m thick GaAs was grown as an n-layer cladding layer 1216; a laminate of 300 pairs of uniformly doped 20 Å GaAs/30 Å thick. $Al_{0.3}Ga_{0.7}As$ superlattice layers as an n-layer core layer 1215; a laminate of 50 pairs of undoped 20 Å GaAs/30 Å $Al_{0.3}Ga_{0.7}As$ superlattice layers as an i-layer core 1213; a 50 Å GaAs as a quantum well layer 1214; a laminate of 50 pairs of undoped 20 Å GaAs/30 Å $Al_{0.3}Ga_{0.7}As$ superlattice layers as an i-layer core layer 1213'; a laminate of 300 pairs of uniformly doped 20 Å GaAs/30 Å $Al_{0.3}Ga_{0.7}As$ superlattice layers as a p-layer core 1212; and a 1.0-$\mu$m GaAs layer as a p-layer cladding layer 1211.

In order to apply a field across part of a Mach-Zehnder interferometer to switch the setting of the interferometer between a symmetrical form and an antisymmetrical form, Be ions were injected through an region (50 $\mu$m long × 1.4 $\mu$m broad × 2 $\mu$m deep) of the interferometer to thereby form a p+-layer 1218 *of a carrier density of* $10^{18}$ cm$^{-3}$. In the ion injection, a resist was coated and used as a mask. A 1000 Å thick Au electrode 1208 (1 $\mu$m broad and 30 $\mu$m long) was deposited on p+-layer 1218 and p-layer cladding layer 1211 other than the p+-layer 1218. In order to prevent the electrode from extending over the p+-layer 1218 and the p-layer cladding layer 1211, a registering mark provided on the substrate 1217 may be used for positioning purposes. The subsequent manufacturing process will be described with reference to the cross section view of FIG. 11. A 3000 Å thick $Si_3N_4$ insulator film 1109 was formed by magnetron sputtering. By etching, a contact hole (not shown) was provided in the electrode 1108 (the electrode 1208 of FIG. 12). In order to prepare the pad 1104, a 2000 Å thick Al film was deposited and etched. A 5000 Å thick $Si_3N_4$ insulator film 1109 was superposed. Au was deposited 5000 Å thick as the screening metal film 1110. An opening 1112 for the window 1103 and an opening 1111 for connecting the pad 1104 with an external lead were formed by etching. A non-reflective $Si_3N_4$ coating was superposed 2000 Å thick in the opening 1112 as the window 1103. In FIG. 10, the insulator film 1109 and metal film 1110 were omitted.

In order to prevent the entrance of magnetic flux into the optical waveguide, a YBaCuO high-temperature superconducting material may be used as the metal film 1110 instead of Au, Al or the like.

The back of the substrate 1102 was ground such that the substrate was 100 $\mu$m thick, and Au was deposited 5000 Å thick as a back electrode 1113 thereon. The resulting wafer was cleaved at both its ends containing a Mach-Zehnder interferometer section, and the substrate back was soldered to a Cu block.

The resulting device was held in an optical measuring cryostat and cooled to 4.2° K. by liquid helium. Under the condition in which the pad 1104 was impressed with a backward bias of 5V, the incident end face of the optical waveguide 1101 was irradiated with continuous light to be modulated of a wavelength of 760 nm from a single wavelength dye laser. Magnetic flux was entered into the window 1103, and the flux density was swept from 0 to 5 teslas. When a change in the intensity of the modulated light produced thereby was examined, it was confirmed that the intensity of the modulated light oscillated due to the Aharonov-Bohm effect of the exciton polaritons. When the backward bias voltage was gradually decreased, the period of the oscillation increased to thereby change the characteristic of the Aharonov-Bohm effect by fluctuations of the polarization of excitons.

A steady-state magnetic field of a flux density of 5 teslas was applied across the device, pulse light from a mode synchronizing dye laser was amplified by a YAG laser exciting dye laser amplifier to provide circularly polarized light, and this light was then irradiated as the modulating light onto the window. The modulating light had an output density of 1 GW/cm$^2$, a pulse width of 1 picosecond and a wavelength of 820 nm. It was confirmed that a process occurs in which by irradiation of the modulating light, the intensity of the modulated light decreased and was then recovered. This process followed the pulse width of the modulating light, and had a high-speed response time on the order of subpicoseconds. When a backward bias voltage of 10V was applied across the pad 1004 of FIG. 10, the device functioned as a Mach-Zehnder anti-symmetrical interferometer, and it was confirmed that only when the modulating light was irradiated, modulated light was output with a response time on the order of subpicoseconds.

When no steady-state magnetic field was applied, the efficiency was lowered even at a temperature higher than 4.2° K., but optical modulation was made by Aharonov-Bohm effect with a response time on the order of subpicoseconds.

The device of the particular example also functioned as a NOT logic device having a response time on the order of subpicoseconds under the conditions in which the device operated as an anti-symmetrical interferometer.

Example 8

A device of a structure shown in FIG. 3 was prepared instead of the Mach-Zehnder interferometer. A stripe-like optical waveguide 1319 and a loop-like optical waveguide 1320 were provided adjacent to each other on a substrate 1302. The distance between the waveguides 1319 and 1320 was within five times the wavelength of the light to be modulated 1305 from a light source 1311. When the light to be modulated 1305 propagates through the waveguide 1319, light also propagated through the loop- o like waveguide 1320 due to the leakage of the optical field. Therefore, when magnetic flux or light 1307 was applied into the window 1303 provided in the region surrounded by the loop-like waveguide 1320, the intensity of the output light 1306 was modulated due to the Aharonov-Bohm effect of excitonic polaritons. In this case, by adjusting the backward bias applied across the entire loop-like waveguide, the degree of the quantum interference effect was selected and the selection between the symmetrical and anti-symmetrical type setting of the interferometer were made. Therefore, only the pad 1304 was provided to lead the electrodes.

The kinds and compositions of the materials used were similar to those of Example 7. The manufacturing process was similar to that of the Example 1. When an optical measurement similar to that in the Example 7 was done, it was confirmed that the intensity of the output light 1306 was modulated with a response time on the order of subpicoseconds.

Example 9

In the Examples 7 and 8, when far infrared light of a wavelength of 337 $\mu$m was irradiated as the modulating light 1007 and 1307, it was confirmed that the intensities of the output light beams 1006 and 1306 changed at the respective periods corresponding to an integer times the frequencies of the modulating light 1007 and 1307. Two far infrared light beams of a wavelength of 337 $\mu$m were irradiated as the modulating light 1307. When the respective phases of the far infrared light beams were equal, changes in the intensities of the output light beams 1006 and 1306 resulted in twice the frequency of single output light and when those infrared light beams deviated $\pi$ out of phase, the frequency of the output light beams 1006 and 1306 became 0. This result shows that if the frequencies of the output light beams 1006 and 1306 are regarded as calculated values, optical logic operations on sum and substraction are performable with a calculation time on the order of subpicoseconds.

Example 10

Figure 14:
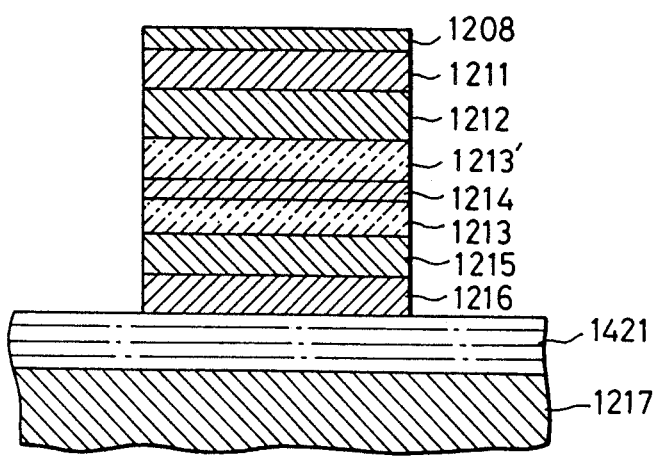
FIG. 14 is a cross section view of an optical waveguide portion which has a multiquantum well structure provided between the waveguide and the substrate to increase a change in the magnetic flux density.

A multiple-quantum well was first grown on a substrate and then an optical waveguide was grown such that even when modulating light beams 1007 and 1307 of lower intensity than that in the examples 7 and 8 were irradiated, the intensities of the emission light beams 1006 and 1306 were modulated. FIG. 14 shows a cross section of the resulting device. The multiple-quantum well 1421 included a laminate of 100 pairs of a 100 ° A GaAs/100 Å Al$_{0.3}$Ga$_{0.7}$As layer. Each layer was an n-layer of a carrier density of $10^{17}$ cm$^{-3}$ in which Si was doped uniformly. The remaining structural portions of the device and its manufacturing process were similar to those of the examples 7 and 8 described with reference to FIG. 10–13.

An optical measurement similar to that in the Examples 7 and 8 was done with the wavelength of the modulating light 1007 and 1307 being 800 nm so as to resonate with the exciton energy level in the multiplequantum well 1421. The intensities of the modulating light 1007 and 1307 were 100 MW/cm$^2$, which was 1/10 of that used in the Examples 7 and 8. As a result, it was confirmed that an optical modulation characteristic similar to that in the Examples 7 and 8 was obtained, and that the use of the multiple-quantum well effectively served to reduce the intensities of the modulating light beams 1007 and 1307.

Example 11

Figure 15:
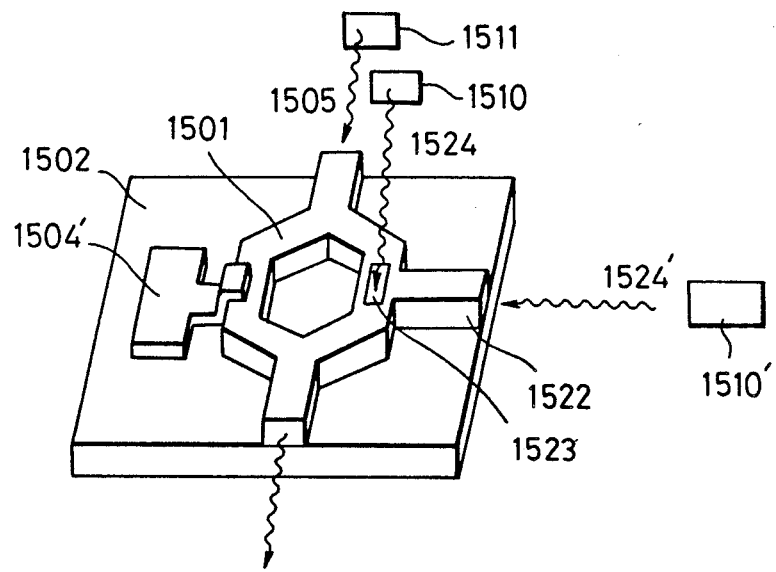
FIG. 15 illustrates the appearance of a further embodiment of the optical quantum interference device according to the present invention.

As shown in FIG. 15, a quantum interference device was prepared in which modulating light was directly irradiated onto an optical waveguide 1501 and optical modulation was performed on the basis of optical Stark effect or the interaction of excitonic polaritons. The optical waveguide 1501 included a Mach-Zehnder interferometer, an optical waveguide window 1523 through which modulating light 1524 from a light source 1510 was irradiated and an optical waveguide 1522 for receiving modulating light 1524' from a light source 1510'. In FIG. 15, for simplifying purposes, the window 1523 and waveguide 1522 are shown together. A pad 1504' was used to select between symmetrical and anti-symmetrical type setting of the interferometer as in the Example 7.

Figure 16:
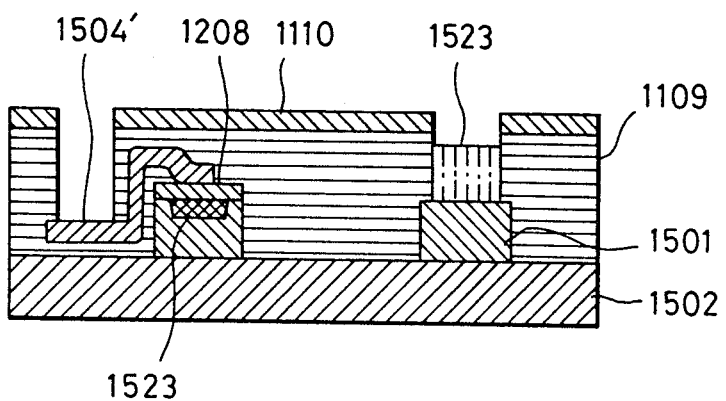
FIG. 16 is a cross section view of an optical waveguide loop portion of the device of FIG. 15.

FIG. 16 is a cross section view of a device with a window similar to the window 1523 of FIG. 15. In the particular example, the application of an electric field to control the polarization of excitons such as that used in the examples 7 - 10 was not necessarily required, and satisfactory effect was produced even under a zero field. However, since the device of the particular embodiment and the same device as that prepared in the example 7 were formed on the same substrate in an example 11 to be described later, the device in the particular embodiment had a structure of a pn junction similar to that in the example 7, suitable for the formation of such a composite device. However, since in the particular example no field was applied across the entire optical waveguide 1501, no electrodes therefor were provided. The same n³⁰ - GaAs wafer substrate as that of the example 7 was used as the substrate 1502. The cross section structure of the waveguide 1501 was similar to that of the device of the Example 7 (see FIG. 12). In order to apply a symmetrical or antisymmetrical type selected field, a dope layer 1525 which played a role similar to that of the p⁺-layer 1218 of the example 7 was formed by the diffusion of Zn. The subsequent process was similar to that of example 7. However, if an optical waveguide window 1523 is provided, a non-reflective coating layer is formed which included a $Si_3N_4$ layer superposed 2000 Å thick as in the window 1103 in the Example 7. Without the window 1523, this process was omitted.

The optical modulation characteristic of the device with the optical waveguide window 1523 was examined. Continuous light of a wavelength of 760 nm from a ring type dye laser 1511 was irradiated as the light to be modulated 1505.

Light of a wavelength of 780 nm and a pulse width of 100 femtoseconds from a collision pulse type mode synchronous dye laser 1510 was focused into a beam having a diameter of 2 μm by an objective and then irradiated as the modulating light 1524. As a result, a modulation efficiency of higher than 10 dB was obtained both in the symmetrical and anti-symmetrical type setting of the interferometer due to the optical Stark effect. The device follows laser 1510 pulses and has a high-speed response time on the order of 100 femtoseconds or less.

The characteristic of the device with the optical waveguide 1522 for irradiation of the modulating light was examined. In this case, the interaction between the excitonic polaritons played an important role in the optical modulation. The same characteristic as that obtained by optical Stark effect was obtained.

The device of the particular embodiment, of course, functions as a NOT logic device of a response time on the order of subpicoseconds if it operates as an anti-symmetrical interferometer.

Example 12

Figure 17:
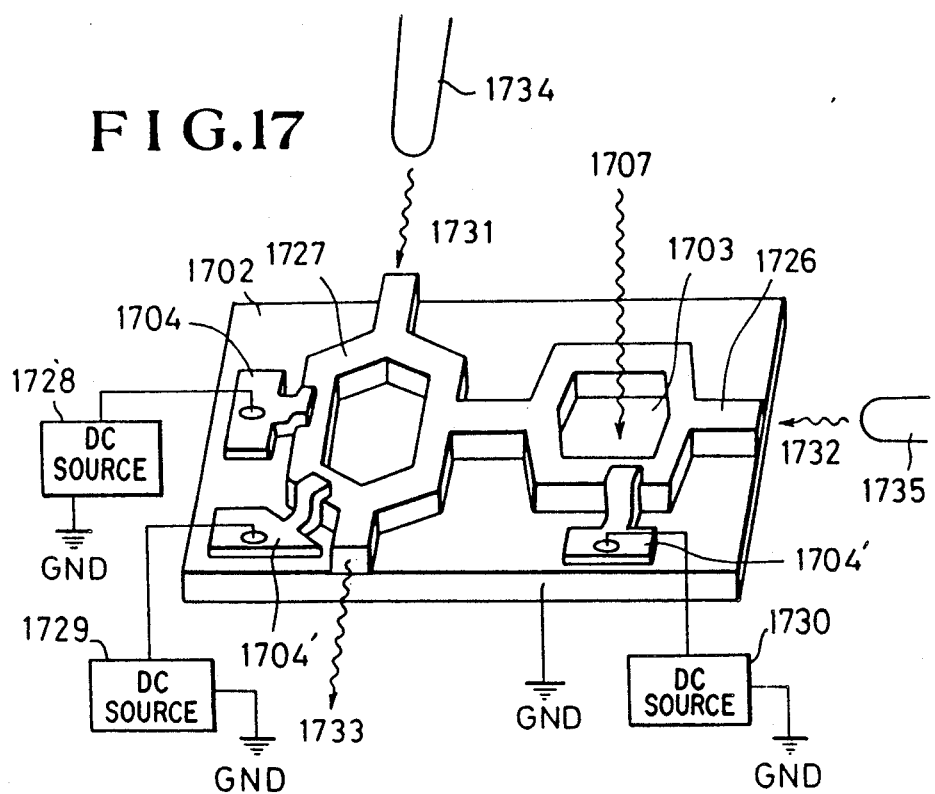
FIG. 17 illustrates a further embodiment of the optical quantum interference device according to the present invention which constitutes optical logic elements by integration.

FIG. 17 illustrates two devices similar to those of the Examples 7 and 11 integrated on the same substrate 1702 to perform an optical logic operation. The manufacturing process was similar to those used in Examples 7 and 11. In FIG. 17, the insulator film 1109 and metal film 1110 of the Example 7 shown in FIG. 11 are omitted. The optical waveguide 1726 had the same structure and function as the optical waveguide prepared in Example 7. The structure and function of the optical waveguide 1727 were the same as those of example 11. An optical waveguide for incidence of the modulating light connected to a Mach-Zehnder interferometer of the optical waveguide 1727 and corresponding to the waveguide 1522 of Example 11 was coupled to the emission end of the waveguide 1726.

A backward bias voltage of 10V was applied from a direct current source 1728 across the entire waveguides 1726 and 1727 via a pad 1704. Backward bias voltages of 5V were applied from direct current sources 1729 and 1730 to parts of the waveguides 1726 and 1728 through pads 1704' to set the interferometers in the anti-symmetrical type. Continuous light of a wavelength of 706 nm from an AlGaAs double heterolaser was entered as light to be modulated 1731 into the waveguide 1727 through a spherical-end fiber 1734. Similarly, continuous light of a wavelength of 760 nm from an AlGaAs double heterolaser was entered as light to be modulated 1732 also through a spherical-end fiber 1735 into the waveguide 1726.

It is recommended that light to be modulated and modulating light should be entered into a quantum interference optical device according to the present invention through optical waveguide means such as an optical fiber as in the particular embodiment. It will be obvious that in addition to fibers, other waveguide means such as optical waveguides formed on the substrate may be used. The magnitude of a coupling coefficient in the light incidence is important in the manufacture of the device. This will be described later in more detail in conjunction with a proposal of a more preferable optical waveguide structure. Pulsating light from a modesynchronous dye laser was amplified by a YAG laser excitation dye laser amplifier into circularly polarized light, which was then irradiated onto the window 1703 as modulating light 1707. The modulating light 1707 had an output density of 1 $GW/cm^2$, a pulse width of 1 picosecond and a wavelength of 820 nm.

It was assumed here that the light to be modulated 1732 and modulating light 1707 were two input signals used in the logic operation. It was confirmed that the output light 1733 was obtained only when two input signals were input to the device and that the AND operation was performed. The time response in the operation was determined by the width of a laser pulse used as the modulating light 1707, and the operational time was on the order of subpicoseconds. In FIG. 17, the light sources to emit the light 1731, 1732 and 1707 are omitted.

Example 13

Figure 18:
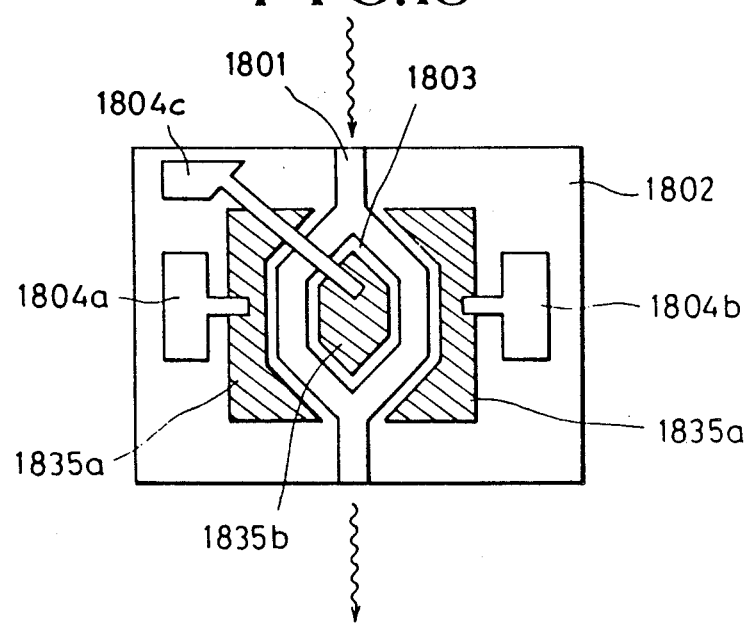
FIG. 18 is a plan view of a further embodiment of the optical quantum interference device according to the present invention which has a structure to apply electric field in the direction in which the field crosses the interferometer along the surface of the substrate.
Figure 19:
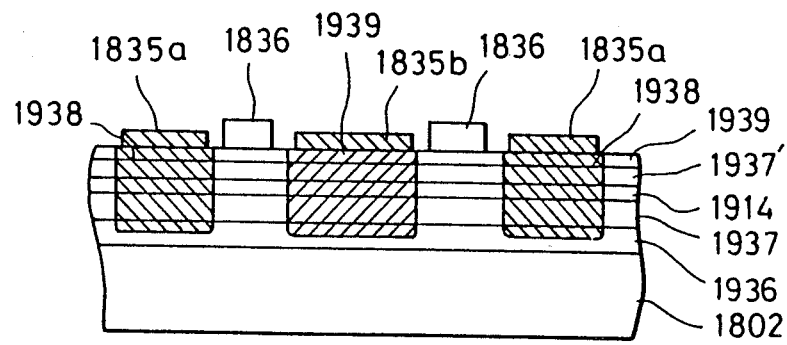
FIG. 19 is a cross section view of an optical waveguide loop portion of the device of FIG. 18.

In the above examples, the pn junctions were formed normal to the surface of the substrate. Namely, the p- and n-regions were disposed normal to the surface of the substrate. In this particular example, a device having the same function as the device of Example 7 was realized by forming pn junctions in a direction parallel to the substrate surface, namely, by disposing the p- and n-regions so as to be parallel to the substrate surface. Thus, the manufacturing process of the optical waveguide layers was simplified advantageously. FIGS. 18 and 19 show the structure of the device. In the particular example, only the cladding layer 1836 was etched when the ridge stripe waveguide was formed by etching. An n-region 1938 was formed as shown in FIG. 19 by implanting Si ions outside the optical waveguide 1801, and a p-region 1939 was formed by implanting Be ions in a region within the optical waveguide or corresponding to the operation section 1803 surrounded by the loop-like structure. In this way, pn junctions were formed extending over the optical waveguide 1801 parallel to the surface of the substrate 1802. Electrodes 1835a, 1835b and pads 1804a, 1804b and 1804c were provided on the pn junctions and an electric field was applied to each of the pads.

The optical waveguide layer was formed by MBE on a semi-insulating GaAs wafer used as the substrate 1802. A 0.3 μm GaAs cladding layer 1936, a core 1937 including a laminate 300 pairs of 20 Å thick GaAs/30 Å $Al_{0.3}Ga_{0.7}As$ superlattice layers, a 50 Å GaAs quantum well layer 1914, a core 1937' including a laminate of 300 pairs of 20 Å GaAs/30 Å $Al_{0.3}Ga_{0.7}As$ superlattice layers, and a 1 μm GaAs cladding layer 1939 were superposed in this order. These were all undoped layers.

The characteristic of Example 13 obtained was the same as that of Example 7.

Example 14

In Example 7-13, a device was prepared in which a Fe doped InP wafer was used as the substrate, a 50 Å $In_{0.6}Ga_{0.4}As_{0.85}P_{0.15}$ layer as the quantum well layer, a laminate of 300 pairs of 20 Å InP/30 Å $In_{0.6}Ga_{0.4}As_{0.85}P_{0.15}$ superlattice layers as the core, and an InP layer as the cladding layer. When the characteristic of the device was examined by using light of a wavelength of 1.5 μm from an optical communication laser as the light to be modulated, and light of a wavelength of 1.6 μm and of a pulse width of 1 picosecond from a color center laser as the modulating light, results similar to those of Examples 7-13 were obtained. Especially, like the example 12, an apparatus with devices integrated on the same substrate was installed at a relay point of an optical fiber communication system to perform logic operations on transmitted signals and to transmit the results via optical fibers.

In the above respective examples, CuCl or ZnSe may be used to form the optical waveguides and hence the device.

Zn was diffused at 550° C. for 10 minutes into the future interferometer section or loop-like waveguide section to form mixed crystals to thereby enlarge the optical absorption end region, which reduced the waveguide loss as much as 50%.

Example 15

Figure 20:
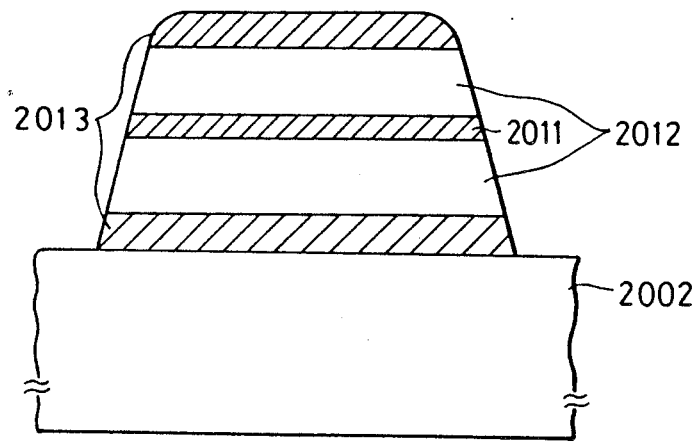
FIG. 20 is similar to FIG. 7 and illustrates one example of the cross section structure of the optical waveguide of the device according to the embodiment of the present invention.

As shown in FIG. 20, layers 2011-2013 were grown by MBE on a semi-insulating GaAs substrate 2002. The quantum well layer 2011 is made of a 50 Å thick GaAs layer, and the two core layers 2012 of a 1.7 μm thick $Al_{0.3}Ga_{0.7}As$ layer were disposed one on an upper surface of the well layer 2011 and the other on an lower surface of the well layer. The layers 2012 functioned as a barrier for the well layer 2011. The upper cladding layer 2013 of a 1.0 μm thick GaAs layer and the lower cladding layer 2013 of a 0.3 μm thick GaAs layer held the cores therebetween. These layers were subjected to the exposure of a resist, and wet etching to form an optical waveguide with a cross section shown in FIG. 20. The waveguide was 10 μm broad.

Figure 21:
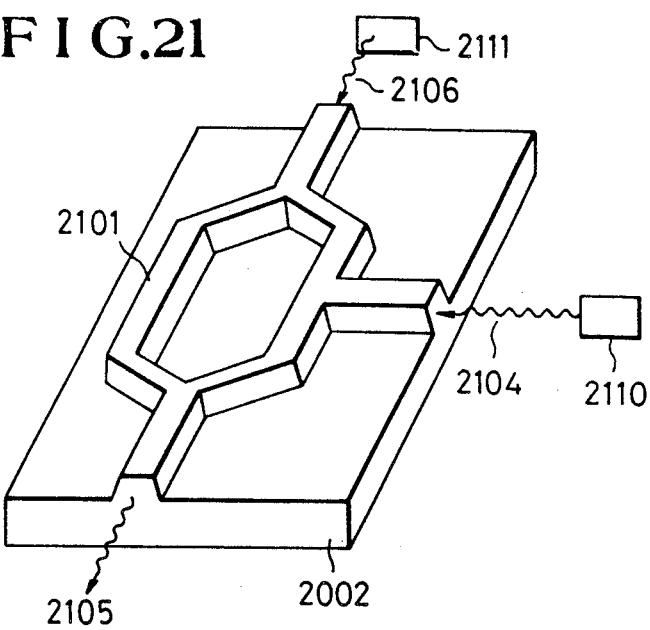
FIGS. 21, 22 and 23 each illustrate the appearance of a further embodiment of the optical quantum interference device according to the present invention.

The entire waveguide is shown in FIG. 21. This device had a structure in which a Mach-Zehnder optical interference waveguide was connected to a modulating light irradiation waveguide.

CW light of a wavelength of 800 nm from an AlGaAs DH laser 2110 was entered as modulating light 2104 into the optical waveguide 2101. Simultaneously, light of a pulse width of 2 picoseconds and a wavelength of 820 nm from a dye laser 2111 was entered as light to be modulated light 2106 to the waveguide 2101. As a result, the output light 2105 exhibited a reduction of its intensity in accordance with the irradiation of a dye laser beam and the response time was on the order of subpicoseconds.

Example 16

In FIG. 20, an optical waveguide was prepared in which a substrate 2002, quantum well layer 2011, core layers 2012 and cladding layers 2013 were made of Fe doped InP, $In_{0.6}Ga_{0.4}As_{0.85}P_{0.15}$, InP, and $In_{0.6}Ga_{0.4}As_{0.85}P_{0.15}$, respectively.

CW light of a wavelength of 1.5 μm from an optical communication laser 2110 shown in FIG. 21 was used as modulating light 2104, and light of a wavelength of 1.57 um and a pulse width of 15 picoseconds from the color center laser 2111 was used as the light to be modulated 2106. In this case, it was recognized that the modulation of the intensity of the output light 2105 was determined by the time response characteristic of the input laser beam and occurred with a response time on the order of subpicoseconds.

Example 17

Assume that the state in which the light to be modulated 2106 is irradiated onto the device in the examples 15 and 16 is 1 and that the state in which no light to be modulated is irradiated was 0. If the state in which the output light 2105 is obtained is 1 and the state in which no output light is obtained is 0, the relationship between the light to be modulated 2106 and the emission light 2105 is equivalent to a NOT gate.

Example 18

Figure 22:
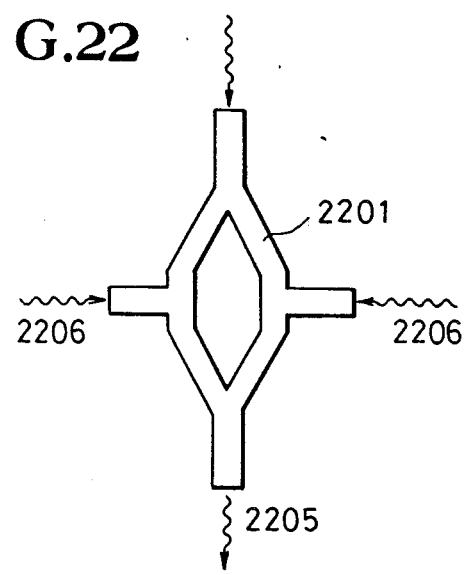

A waveguide 2001 such as that shown in FIG. 22 and made of materials similar to those used in Examples 15 and 16 was formed on a substrate (not shown). Using a correspondence similar to that used in Example 17, the relationship between the two input lights 2205 and the output light 2206 is equivalent to $\overline{XOR}$.

Example 19

A device was prepared which included a stacked structure in which a quantum well layer 2011 including a laminate of 10 GaAs (50 Å) layers/10 $Al_{0.3}Ga_{0.7}As$ (80 Å) layers in FIG. 20. A device was prepared in which Zn was diffused at 550° C. for ten minutes in the device portion other than the portion directly underlying the window 503 of FIG. 5A or in the device portion other than the intersection of the waveguide 501 of FIG. 5B to thereby form a mixed crystal structure.

By such processing, the optical responsive sensitivity was increased and the degree of attenuation of the excitonic polaritons was reduced.

Example 20

Figure 23:
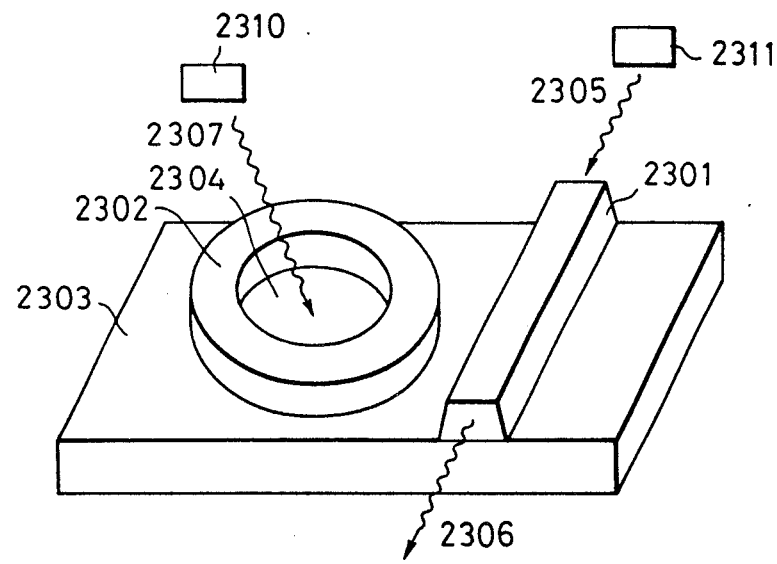
Figure 24:
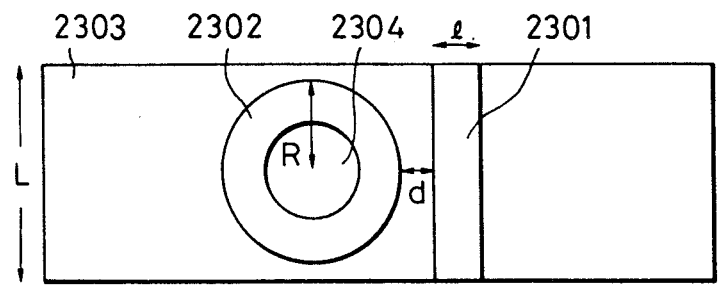
FIG. 24 is a top plan view of the device of FIG. 23.

A layer such as that shown in FIG. 20 was grown by MBE on a semi-insulating GaAs substrate. A 50 Å thick GaAs layer was formed as a quantum well layer 2011, and a pair of barrier layers of $Al_{0.3}Ga_{0.7}As$ was formed 1.5 μm thick so as to hold the quantum well layer 2011 therebetween. These layers constituted the core layers 2012. Cladding layers 2013 made of GaAs were deposited 1 μm thick. After electron beam exposure, these layers were subjected to dry etching to thereby form a linear and a loop-like optical waveguides 2301 and 2302 shown in both FIGS. 23 and 24, respectively. The width l of the waveguide was 5 μm and the loop radius R was 50 μm, and the device length L was 500 μm.

Figure 25:
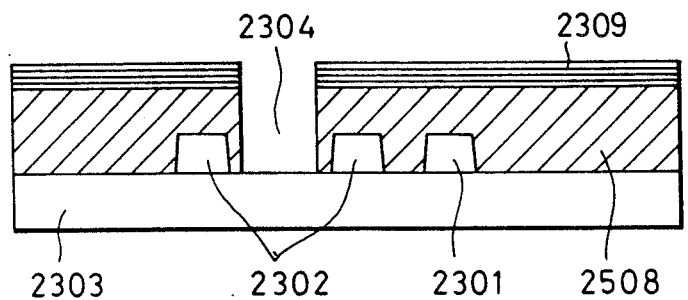
FIG. 25 is a cross section view of the device of FIG. 23.

As shown in FIG. 25, a $SiO_2$ insulator layer 2508 was formed 100 nm thick on a substrate 2303 by sputtering. A thin screening silver film 2309 was superposed 100 nm thick on the insulator layer 2508 by sputtering. A window 2304 through which modulating light 2307 was irradiated was formed by dry etching. The radius of the window was 40 μm.

The resultant semi-finished product was cooled at 4.2K in liquid helium, light of 750 nm resonating substantially with the absorption wavelength of weighty excitons was entered as light to be modulated 2305 from a light source 2311 to the waveguide 2301. When modulating light 2307 of a waveguide of 119 μm from a far infrared laser 2310 was irradiated onto the window 2304, a change in the intensity of the output light 2306 corresponding to the modulating light 2307 appeared to thereby effect photodetection. The response time of this device was exhibited to be on the order of sub-picoseconds.

Example 21

Figure 26:
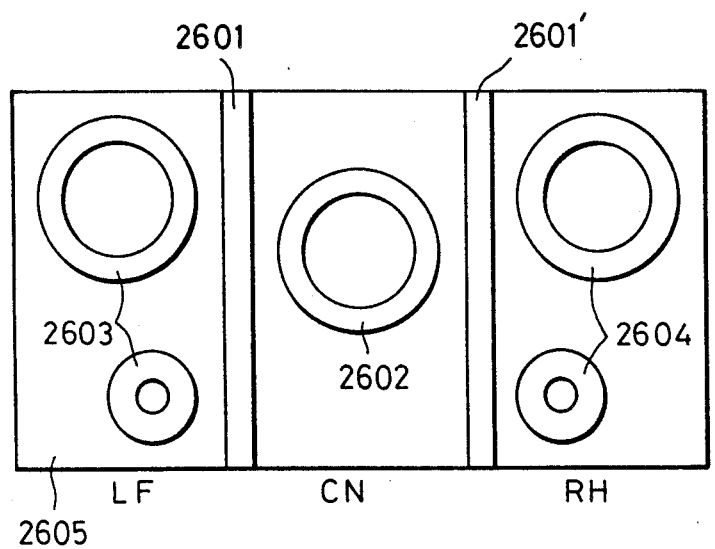
FIG. 26 is a plan view of an embodiment including devices, such as that shown in FIG. 23, integrated on the same substrate.

A device such as that shown in FIG. 26 was formed on a substrate 2605 using the device prepared in Example 20. A measurement similar to that done in Example 18 was done. When modulating light was irradiated into a central loop 2602 (in a row CN), light beams to be modulated which propagated through the waveguides 2601 and 2601' one on each side of the loop 2602 were modulated. When the loop 2603 on the left-hand row (LF) was irradiated with light, only the light to be modulated propagating through the left-hand optical waveguide 2601 adjacent to the loop was modulated. In the case of the right-hand row (RH) loop 2604, only the light to be modulated propagating through the right-hand optical waveguide 2601' was modulated. The period of modulation of the output light was increased as the diameter of the loop decreased when the modulating light was irradiated onto the loop.

Example 22

Figure 27A:
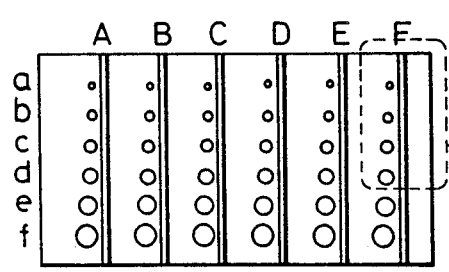
FIGS. 27A and 27B each are a top plan view of another embodiment including devices, such as that shown FIG. 23, integrated on the same substrate.
Figure 27B:
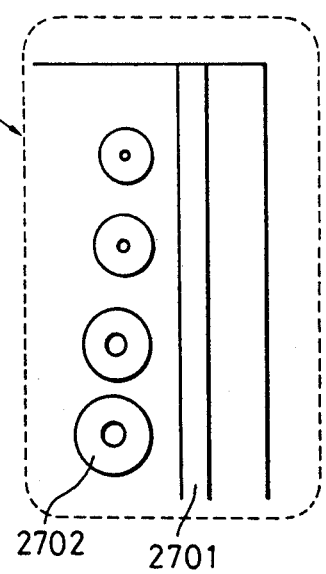

An integrated device was constituted as shown in FIGS. 27A and 27B using the half-finished product prepared in Example 20. Six linear waveguides 2701 A-F as signal lines and six kinds of loops 2702 a-f were provided. When light beams to be modulated were entered into A-F, and the period of the output light was monitored, the device functioned as a 2-dimensional position-sensitive photosensor.

The device functioned as a numeral generator by causing A-F to correspond to 6-place numerals and causing a-f to correspond to numerals at the respective places in the device constituted in the example 22.

Example 23

A device was formed in which the substrate 2303 of FIG. 25 in Example 20 was made of InP doped with Fe, the quantum well layer 2011 was made of $In_{0.6}Ga_{0.4}As_{0.85}P_{0.15}$, the barrier layer 2012 was made of InP, and the cladding layer 2013 was made of $In_{0.6}Ga_{0.4}As_{0.85}P_{0.15}$ in Example 20. By doing a measurement similar to that in Examples 18-20, using light to be modulated 2305 of a wavelength of 1.5 $\mu$m from an optical communication laser 2311, similar results were obtained.

While the preferred aspects of the optical quantum interference devices according to the present invention have been described, the structure of the optical waveguide will now be described in more detail.

Useful semiconductor materials constituting an optical waveguide through which excitonic polaritons comprising a coherent combination of light and excitons are propagated are Group III-V and II-VI semiconductor compounds such as GaAs, InP, GaSb, InSb, InAs, GaP, ZnS, ZnSe, ZnTe, CdS, CdSe or CdTe, ternary and quanternary semiconductor materials and CuCl. Such waveguides serve to greatly increase the effects of the present invention by forming a quantum well layer therein along the direction of propagation of the excitonic polaritons. One important factor is a coupling coefficient effective when the light to be modulated is entered into the incident end of a quantum interference optical device according to the present invention. Coupling has a great influence on an increase in the conversion efficiency from the light to be modulated to excitonic polaritons in the actual device. One effective means to increase the coupling coefficient is to appropriately dispose and form a quantum well layer in the waveguide.

Figure 28A:
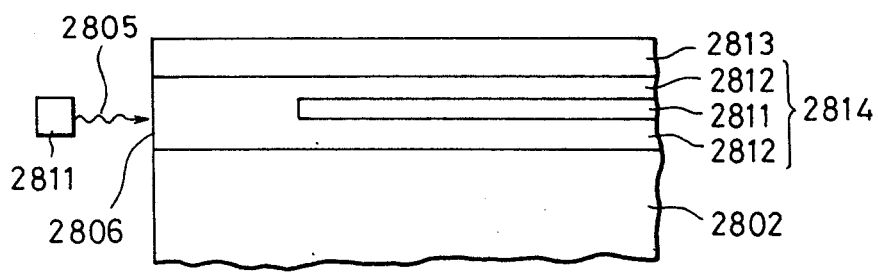
FIGS. 28A and 28B and FIGS. 29 and 30 each illustrate a preferred form of the incident end face portion of the optical waveguide of the optical quantum interference device according to the present invention.

FIG. 28A shows the structure of the light incident end of such optical waveguide. A semiconductor layer 2814 as a core of the optical waveguide was formed on a substrate 2802, and covered with a cladding layer 2813 in order to complete the basic structure of an optical waveguide. What was important here was the position or structure of a quantum well layer 2811 formed within the core layer 2812. In FIG. 28A, the quantum well layer 2811 was formed within the optical waveguide distant from an end 2806 into which light to be modulated 2805 from a light source 2811 was entered. The end face was usually covered with an anti-reflective film. As just described, when the quantum well layer 2811 contributing to the propagation of light was provided distant from the waveguide end, the loss produced when light was guided from the waveguide portion in which no quantum well layer 2811 was formed to the waveguide portion in which an quantum well layer was formed was decreased by the phenomenon of a reflective index difference.

The conversion efficiency was also improved even by gradually changing the thickness of the quantum well layer 2811 in the direction of propagation of light.

Figure 28B:
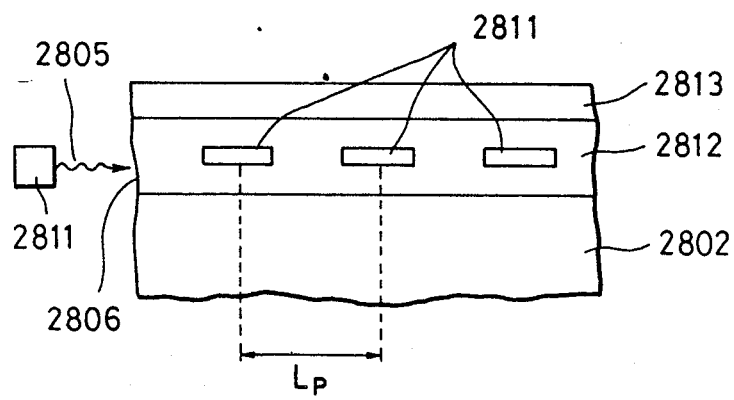

FIG. 28B shows another preferred form of the waveguide. The same reference numerals denote the same structural element in FIGS. 28A and 28B. The feature of the example of FIG. 28B was the provision of a plurality of quantum well layers disposed at constant intervals Lp. When the interval Lp was $n\lambda/4$ where n is an integer and $\lambda$ was the wavelength of a second quantum state such as excitonic polaritons propagating through the optical waveguide, the reflective component of the light to be modulated was reduced. Therefore, the efficiency of conversion from the modulated light to an excitonic polariton was improved equivalently.

Figure 29:
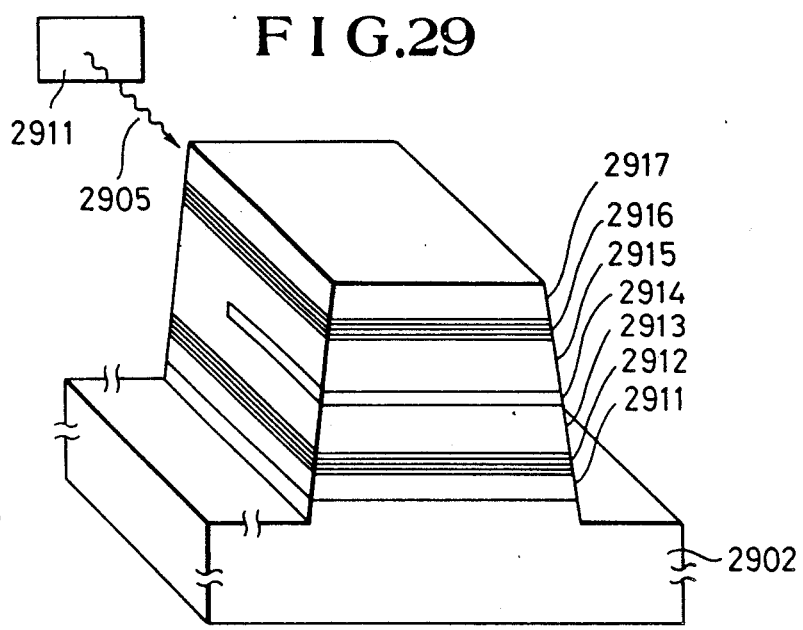

An example of a specific optical waveguide will be described. FIG. 29 illustrates a cross section structure of the waveguide portion. Grown by crystal growth on a GaAs substrate 2902 using molecular beam epitaxy were a 0.3 $\mu$m thick GaAs layer 2911, an 800 Å thick superlattice layer (GaAs/A (GaAs)) 2912, a 1.8 $\mu$m thick $Al_{0.3}Ga_{0.7}As$ core layer 2913, a 50 Å thick quantum layer 2914, a 1.8 $\mu$m thick $Al_{0.3}Ga_{0.7}As$ core layer 2915, and 800 Å thick superlattice layer (GaAs/A (GaAs)) 2916 and a 1.0 $\mu$m thick GaAs cladding layer 2917. A ridgestripe type quantum well optical waveguide was formed by regular non-selective etching. In order to form an optical waveguide portion in which no quantum well was formed through a 100 $\mu$m long portion of a 500 $\mu$m waveguide starting from the light incident end therefore, part of the quantum well layer 2914 formed was etched away, and the core layer 2915 was then grown. Thus, the conversion efficiency of the light to be modulated 2905 from an external light source 2911 to excitonic polaritons was improved by 20%. In the case of a waveguide having a quantum well provided through the overall length of the waveguide through which the excitonic polaritons propagated, it was seen that the conversion efficiency was low, for example, about 5%, and thus the effect produced by the present structure was large.

Figure 30:
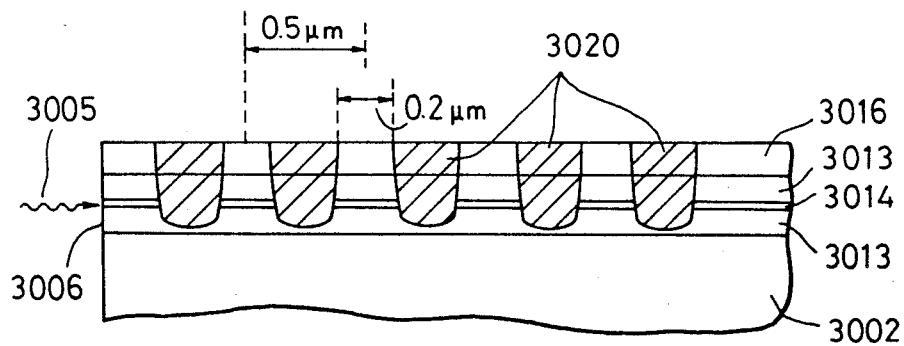

A device was prepared in which GaAs/A (GaAs) quantum well layer 3014, an A/GaAs core 3013 and a GaAs cladding layer 3016 were formed by crystal growth on a GaAs substrate as shown in FIG. 30 on the same conditions as the above optical waveguide, and Zn-diffused regions 3020 were formed to thereby form quantum well layers 3014 (0.2 μm long) by mixed crystal at periods of 0.5 μm. When light 3005 of a wavelength of 760 nm was entered into the incident end 3006 of the quantum well waveguide, the conversion efficiency from light to excitonic polaritons was 15%, which was twice that provided by a regular quantum well optical waveguide.

While the above two examples use the GaAs substrate 2902 and 3002, other materials such as InP may be used for the substrate to achieve a conversion efficiency similar to that of the above optical waveguide structure. Table 1 below shows the experimental results collectively.

TABLE 1

| SUBSTRATES | CORES | QUANTUM WELLS | CLADDING LAYERS | EFF. (1) | EFF. (2) |
|---|---|---|---|---|---|
| InP | InGaAsP | InP | InGaAs | 18% | 12% |
| GaSb | $Al_{0.35}Ga_{0.65}Sb$ (4 μm) | GaASb (70 Å) | GaSb (1.0 μm) | 21% | 15% |
| InAs | $AlSb_{0.84}As_{0.16}$ (3.5 μm) | InAs (50 Å) | InAs | 20% | 17% |
| GaP | GaPAs (4.0 μm) | GaP (50 Å) | GaP | 16% | 12% |
| GaSb | InSb (4.0 μm) | GaSb (60 Å) | InSb | 18% | 11% |
| ZnSe | ZnS (4.0 μm) | ZnSe (50 Å) | ZnSe | 21% | 8% |

Notes:
EFF. (1) represents the conversion efficiencies obtained when a quantum well layer is formed at a distance of 100 μm from the incident end of an optical waveguide 500 μm long.
EFF. (2) represents the conversion efficiencies obtained when a plurality of short quantum wells (0.2 μm long) are formed at periods 10 times the wavelength of a polariton.

Although the invention has been described with reference to an optical modulating device, an optical logic device or a light detecting device, it is to be appreciated that other optical devices are applicable, including an optical amplifier, an optical switching device or the like.

The invention has been described with reference to the preferred embodiments. Obviously, modifications and alterations will occur to those of ordinary skill in the art upon reading and understanding the present specification. It is intended that the invention be construed as including all such alterations and modifications in so far as they come within the scope of the appended claims or the equivalent thereof.

What is claimed is:

1. An optical quantum interference device comprising:
    a light source emitting light to be modulated;
    a waveguide region, having a first quantum state formed by an electron and other particle state, propagating the light to be modulated therethrough to couple with the first quantum state forming a second quantum state and conserving therein the coherency of the second quantum state;
    means for interacting with the second quantum state to apply to said second quantum state a physical quantity to change a phase of a wavefunction of said second quantum state; and
    means for producing as an output a change in the phase of the wavefunction of said second quantum state caused by the interaction as a change in the intensity of the light subjected to the interaction thereby causing the light to be modulated.

2. An optical quantum interference device according to claim 1, wherein the waveguide region includes a closed circuit.

3. An optical quantum interference device according to claim 2, wherein the closed circuit is provided in the vicinity of the waveguide region.

4. An optical quantum interference device comprising:
    a light source emitting light to be modulated; p1 a waveguide region, having a first quantum state formed by an electron and another particle state, propagating the light to be modulated therethrough to couple with the first quantum state forming a second quantum state and conserving therein the coherency of the second quantum state;
    means for interacting with the second quantum state to apply to said second quantum state a physical quantity to change a phase of a wavefunction of said second quantum state; and
    means for producing as an output a change in the phase of the wavefunction of said second quantum state caused by the interaction as a change in the intensity of the light subjected to the interaction thereby causing the light to be modulated
    wherein the waveguide region includes a closed circuit;
    wherein the closed circuit is provided in the vicinity of the waveguide region; and
    wherein the distance between the closed circuit and the waveguide region is less than 5 times the wavelength of the light to be modulated.

5. An optical quantum interference device according to claim 1, including means for applying an electric field across the waveguide region.

6. An optical quantum interference device according
    a light source emitting light to be modulated;
    a waveguide region, having a first quantum state formed by an electron and another particle state, propagating the light to be modulated therethrough to couple with the first quantum state and conserving therein the coherency of the second quantum state forming a second quantum state
    means for interacting with the second quantum state to apply to said second quantum state a physical quantity to change a phase of a wavefunction of said second quantum state; and
    means for producing as an output a change in the phase of the wavefunction of said second quantum state caused by the interaction thereby causing the light to be modulated as a change in the intensity of the light subjected to the interaction;

wherein the closed circuit has a length substantially equal to the mean free path of the second quantum state.

7. An optical quantum interference device according to claim 1, wherein the light to be modulated has a wavelength substantially equal to an absorption wavelength of the first quantum state or a wavelength of a reflected light.

8. An optical quantum interference device according to claim 1, wherein an energy of optical absorption edge in a region other than the waveguide region is increased to decrease loss of the light to be modulated in the waveguide.

9. An optical quantum interference device according to claim 1, wherein the physical quantity is a magnetic field.

10. An optical quantum interference device according to claim 9, wherein the magnetic field includes a modulating light applied by the means for interacting with said second quantum state.

11. An optical quantum interference device according to claim 10, further comprising an operation section to which the modulating light is applied has a non-reflective structure.

12. An optical quantum interference device according to claim 1, wherein the non-reflective structure includes a laminate of an insulator film and a metal film formed on the operation section.

13. An optical quantum interference device according to claim 1, wherein said waveguide region includes a core, at least of which has a quantum well structure made of a material selected from the group consisting of GaAs, InP, CuCl, ZnSe, CdS and their mixed crystals.

14. An optical quantum interference device comprising:
a substrate;
an input section receiving light to be modulated;
a waveguide region formed on the substrate and having a first quantum state formed by an electron and another particle state, guiding the light to be modulated from the input section to couple with the first quantum state to form a second quantum state and conserve therein the coherency of the second quantum state;
an operation section receiving a physical quantity to couple with the second quantum state to thereby change the phase of a wavefunction to describe the second quantum state; and
means for extracting a change in the phase of the wavefunction to describe the second quantum state caused by the interaction as a change in the intensity of the light that is modulated.

15. An optical quantum interference device according to claim 14, including a multiple-quantum well structure provided between the substrate and the waveguide region for absorbing a modulating light and inducing a magnetic change.

16. A method for modulating light in an optical quantum interference device comprising the steps of: receiving light to be modulated, shifting the phase of a wavefunction of the quantum state formed by the interaction of the light to be modulated and an electron to cause an interference of the quantum state, and detecting the interference as a change in the intensity of the modulated light.

17. A method for modulating light in an optical quantum interference device comprising the steps of: coupling an electron and light into a quantum state formed in a material through the interaction of the electron and the light, and causing the modulation to the electron to act on the light.

18. An optical quantum interference device comprising:
a section for receiving light to be modulated;
a waveguide region, containing a quantum state formed by the interaction of an electron and the light to be modulated, coupling the quantum state with the light to be modulated from the section for receiving the light to be modulated;
an operation section receiving a physical quantity to shift the phase of a wavefunction of the quantum state; and
modulated light outputting section outputting an interference of the quantum state, caused by the shift of the phase, as a change in the intensity of the modulated light.

19. An optical quantum interference device comprising:
a first optical waveguide, containing an interferometer;
a second optical waveguide having a loop-like configuration adjacent to said first optical wave-guide and formed on a substrate of a semiconductor or an insulator, wherein the intensity of light to be modulated propagating through the first optical waveguide is modulated by irradiating modulating light onto a region other than the first or second optical waveguide thereby changing the phase conditions of the exciton state or electron-system exciton state.

20. An optical quantum interference device according to claim 19, comprising means for adjusting an electric field applied to the optical waveguide to control the signal processing characteristic and processing efficiency of the device.

21. An optical quantum interference apparatus comprising a plurality of optical quantum interference devices coupled in parallel or in a multistage configuration wherein each optical quantum interference device comprises:
a light source emitting light to be modulated;
a waveguide region, having a first quantum state formed by an electron and another particle state, propagating the light to be modulated therethrough to couple with the first quantum state forming a second quantum state and conserving therein the coherency of the second quantum state;
means for interacting with the second quantum state to apply to said second quantum state a physical quantity to change a phase of wavefunction of said second quantum state; and
means for producing as an output a change in the phase of the wavefunction of said second quantum state caused by the interaction as a change in the intensity of the light subjected to the interaction thereby causing the light to be modulated.

22. An optical quantum interference apparatus comprising:
a light source emitting light to be modulated;
a waveguide region, having a first quantum state formed by an electron and another particle state, propagating the light to be modulated therethrough to couple with the first quantum state forming a second quantum state and conserving therein the coherency of the second quantum state;

means for interacting with the second quantum state to apply to said second quantum state a physical quantity to change a phase of wavefunction of said second quantum state; and means for producing as an output a change in the phase of the wavefunction of said second quantum state caused by the interaction as a change in the intensity of the light subjected to the interaction thereby causing the light to be modulated.

wherein the physical quantity is a magnetic field;

wherein the magnetic field includes a modulating light applied by the means for interacting with said second quantum state; and wherein the modulating light has a frequency in a far infrared area.

23. An optical quantum interference device comprising:

a light source emitting light to be modulated;

a waveguide region, having a first quantum state formed by an electron and another particle state, propagating the light to be modulated therethrough to couple with the first quantum state forming a second quantum state and conserving therein the coherency of the second quantum state;

means for interacting with the second quantum state to apply to said second quantum state a physical quantity to change a phase of wavefunction of said second quantum state; and means for producing as an output a change in the phase of the wavefunction of said second quantum state caused by the interaction as a change in the intensity of the light subjected to the interaction thereby causing the light to be modulated.

wherein the physical quantity is a magnetic field;

wherein the magnetic field includes a modulating light applied by the means for interacting with said second quantum state; and wherein the modulating light includes circularly polarized light.

24. An optical quantum interference device according to claim 23, wherein the circularly polarized light exists in the operation section.

25. An optical quantum interference device according to claim 17, wherein the quantum state has a polarity to interact with light.

26. An optical quantum interference device comprising:

a light receiving portion receiving light to be modulated;

an interferometer portion having a closed waveguide path being optically connected to the light receiving portion so as to introduce the light therein, wherein the closed waveguide path has particles which have electric dipoles by which the light interacts with the particles so as to generate a quantum state;

means for modulating said quantum state so that the light is interfered with the closed waveguide path; and a light output portion for outputting the interfered light.

27. An optical quantum interference device comprising:

a light receiving portion receiving light to be modulated;

an interferometer generating a quantum state which comprises an electron and a photon of the light, wherein the light is modulated by a means for interacting with the quantum state; and a light outputting portion for outputting interfered light.

28. An optical quantum interference device comprising an interferometer portion in which light to be modulated generates a quantum state by interaction with an electron, and the light is modulated by a means for interacting with the quantum state.

29. The device as set forth in claim 28 wherein the quantum state has a polarization.

30. The device as set forth in claim 28 wherein the light to be modulated has an energy which is substantially absorbed by the quantum state.

31. An optical quantum interference device comprising:

a light input portion for receiving a light to be modulated;

an operation section to which is applied a physical quantity;

a waveguide portion having a first quantum state wherein an energy of the light substantially coincides with an energy level in the first quantum state so that the light and the first quantum state form a second quantum state which is modulated by the physical quantity; and a light output portion for outputting a modulated light which is caused by the modulation of the second quantum state.

* * * * *

UNITED STATES PATENT AND TRADEMARK OFFICE
CERTIFICATE OF CORRECTION

PATENT NO. : 4,957,337

DATED : 18 September 1990

INVENTOR(S) : Kensuke OGAWA et al.

It is certified that error appears in the above-identified patent and that said Letters Patent is hereby corrected as shown below:

| Column | Line | Corrections |
|---|---|---|
| 1 | 20 | After "software" insert --,--; after "has" delete ",". |
| 1 | 23 | Delete "to handle" and insert --concerned with quantum-mechanical descriptions of--. |
| 1 | 23-24 | Delete "by quantum-mechanical descriptions". |
| 1 | 68 | Change "electron" to --electrons--. |
| 6 | 60 | Change "a" to --an--. |
| 7 | 41 | Change "01" to --101--. |
| 7 | 42 | Change "01" to --101--. |
| 7 | 60 | Change "05" to --105--. |
| 8 | 60 | Change "plank" to --Planck--. |
| 9 | 11 | Change "$B_1$ 0" to --$B_1$ --> 0--. |
| 9 | 17 | Change "1 + (31 1)" to --1 + (-1)--. |
| 9 | 42 | Change "greatly is" to --is greatly--. |
| 10 | 47 | Replace "changes" with --change--. |
| 11 | 39 | Change "halffinished" to --half-finished--. |

UNITED STATES PATENT AND TRADEMARK OFFICE
CERTIFICATE OF CORRECTION

PATENT NO. : 4,957,337

DATED : 18 September 1990

INVENTOR(S) : Kensuke OGAWA et al.

It is certified that error appears in the above-identified patent and that said Letters Patent is hereby corrected as shown below:

| Column | Line | Corrections |
|---|---|---|
| 14 | 11 | Change "an" to --a--. |
| 14 | 13 | Change "$p^+$-layer 1218 of a" to --$P^+$-layer 1218 of a--. |
| 14 | 14 | Change "carrier density of" to --carrier density of--. |
| 15 | 37 | Change "loop- o like" to --loop-like--. |
| 15 | 47 | Change "were" to --was--. |
| 16 | 28 | Change "multiplequantum" to --multiple-quantum--. |
| 17 | 1 | Change "$n^{30}$ - GaAs" to --$n^+$-GaAs--. |
| 18 | 63 | Change "laminate 300" to --laminate of 300--. |
| 19 | 16 | After "Especially" delete "like". |
| 19 | 17 | Change "the example" to --as in Example--. |
| 19 | 37 | Change "an" to --a--. |
| 20 | 31 | Do not boldface "10" and "layers". |

UNITED STATES PATENT AND TRADEMARK OFFICE
CERTIFICATE OF CORRECTION

PATENT NO. : 4,957,337

DATED : 18 September 1990

INVENTOR(S) : Kensuke OGAWA et al.

It is certified that error appears in the above-identified patent and that said Letters Patent is hereby corrected as shown below:

| Column | Line | Corrections |
|---|---|---|
| 22 | 25 | Change "an" to --a--. |
| 22 | 33 | Change "element" to --elements--. |
| 22 | 47 | Do not boldface "800". |
| 22 | 49 | Do not boldface "50". |
| 23 | 57 | Change "other" to --another--. |
| 24 | 11 | After "modulated" delete "p1". |
| 24 | 55 | Change "according" to --comprising--. |
| 24 | 60 | After "state" insert --forming a second quantum state--. |
| 24 | 62 | After "quantum state" insert --;-- and delete "forming a second quantum state". |
| 25 | 1 | After "interaction" delete "thereby causing the". |
| 25 | 2 | Delete "light to be modulated". |
| 25 | 3 | After "interaction" insert --thereby causing the light to be modulated--. |

UNITED STATES PATENT AND TRADEMARK OFFICE
CERTIFICATE OF CORRECTION

PATENT NO. : 4,957,337

DATED : 18 September 1990

INVENTOR(S) : Kensuke OGAWA et al.

It is certified that error appears in the above-identified patent and that said Letters Patent is hereby corrected as shown below:

| Column | Line | Corrections |
|---|---|---|
| 25 | 29 | Change "claim 1" to --claim 11--. |
| 26 | 55 | Before "wavefunction" insert --a--. |
| 27 | 30 | Before "wavefunction" insert --the-. |
| 27 | 36 | After "modulated" change "." to --;- |

Signed and Sealed this

Seventh Day of April, 1992

Attest:

HARRY F. MANBECK, JR.

Attesting Officer    Commissioner of Patents and Trademarks